(12) United States Patent
Grossman et al.

(10) Patent No.: US 10,439,292 B2
(45) Date of Patent: Oct. 8, 2019

(54) ELECTROMAGNETIC ENERGY SHIELDING SYSTEMS, APPARATUSES, AND METHODS

(71) Applicant: The Johns Hopkins University, Baltimore, MD (US)

(72) Inventors: Kenneth R. Grossman, Olney, MD (US); Joseph A. Miragliotta, Ellicott City, MD (US); Adam J. Maisano, Sykesville, MD (US); Douglas B. Trigg, Laurel, MD (US); Steven M. Storck, Timonium, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 16/026,685

(22) Filed: Jul. 3, 2018

(65) Prior Publication Data
US 2019/0140357 A1    May 9, 2019

Related U.S. Application Data

(63) Continuation-in-part of application No. 15/884,426, filed on Jan. 31, 2018.

(60) Provisional application No. 62/481,153, filed on Apr. 4, 2017, provisional application No. 62/554,137, filed on Sep. 5, 2017, provisional application No. 62/554,141, filed on Sep. 5, 2017, provisional application No. 62/554,143, filed on Sep. 5, 2017, provisional application No. 62/554,144, filed on Sep. 5, 2017.

(51) Int. Cl.
*H03H 7/24* (2006.01)
*H01Q 15/00* (2006.01)
*H01Q 17/00* (2006.01)
*H01Q 1/52* (2006.01)

(52) U.S. Cl.
CPC .......... *H01Q 15/0086* (2013.01); *H01Q 1/52* (2013.01); *H01Q 17/007* (2013.01); *H03H 7/24* (2013.01)

(58) Field of Classification Search
CPC .... H01Q 15/008; H01Q 15/0086; H01Q 1/52; H01Q 17/007; H01Q 17/008; H01P 1/22; H01P 1/222; H03H 7/24; H03H 11/24
USPC ............................................. 333/81 R, 81 B
See application file for complete search history.

(56) References Cited

U.S. PATENT DOCUMENTS

| | | | | |
|---|---|---|---|---|
| 2002/0167457 A1* | 11/2002 | McKinzie, III | .......... | H01Q 3/46 343/909 |
| 2003/0052757 A1* | 3/2003 | McKinzie, III | ...... | H01Q 15/008 335/6 |

* cited by examiner

*Primary Examiner* — Stephen E. Jones
(74) *Attorney, Agent, or Firm* — Noah J. Hayward

(57) ABSTRACT

Electromagnetic shielding systems, apparatuses, and method are provided. One apparatus is an example free-space absorber metamaterial that includes a first array of patches disposed at a first plane, a conductive backplane disposed at a structural surface plane, and a first dielectric spacer disposed between the first array of patches and the conductive backplane. A first bandwidth of absorption for the free-space absorber metamaterial may be based on the area of a patch in the first array of patches, the first electrical resistance of a patch in the first array of patches, and the first gap distance taken between the first array of patches and the conductive backplane.

20 Claims, 30 Drawing Sheets

_US 10,439,292 B2_

ELECTROMAGNETIC ENERGY SHIELDING SYSTEMS, APPARATUSES, AND METHODS

CROSS-REFERENCE TO RELATED APPLICATIONS

This application is a continuation-in-part of prior-filed, co-pending U.S. application Ser. No. 15/884,426 filed Jan. 31, 2018, which claims priority to and the benefit of U.S. Provisional Application Ser. No. 62/481,153, filed Apr. 4, 2017, the contents of both of which are hereby incorporated by reference in their entireties. This application also claims priority to and the benefit of: co-pending U.S. Provisional Application Ser. No. 62/554,137 filed on Sep. 5, 2017; co-pending U.S. Provisional Application Ser. No. 62/554,141 filed on Sep. 5, 2017; co-pending U.S. Provisional Application Ser. No. 62/554,143 filed on Sep. 5, 2017; and co-pending U.S. Provisional Application Ser. No. 62/554,144 filed on Sep. 5, 2017, the contents of all of which are hereby incorporated by reference in their entireties.

STATEMENT OF GOVERNMENTAL INTEREST

This invention was made with Government support under contract number FA8222-16-C-0005 awarded by the United States Air Force. The Government has certain rights in the invention.

TECHNICAL FIELD

Example embodiments generally relate to the propagation of electromagnetic fields and waves and, in particular, relate to approaches for inhibiting the propagation of electromagnetic fields and waves.

BACKGROUND

As radio communication devices become increasingly ubiquitous, it has become increasingly important to be able to construct physical structures (e.g., buildings and, in particular interior spaces of buildings) that operate to limit or eliminate electromagnetic interference internal to the structure. Further, there are various types of equipment, for example in the medical industry, that create high levels of electromagnetic interference that it is desirable to contain within select spaces. Further, some equipment can be hypersensitive to the introduction of outside electromagnetic (EM) energy that cause erroneous readings or damages the equipment. As such, there is a need to create spaces that are shielded from EM energy that may propagate through undesired boundaries.

Conventional approaches to shielding spaces from EM energy propagation have generally not been successful because of practical limitations. In this regard, the existence of discontinuities in the form of, for example, doors, windows, ventilation openings, and the like can create leakage points that significantly degrade the effectiveness of conventional approaches. As such, it would be desirable to implement shielding systems that can overcome these practical limitations and provide for an effectively shielded environment, while still permitting the space to be conveniently usable and accessible by individuals.

BRIEF SUMMARY OF SOME EXAMPLES

According to some example embodiments, electromagnetic shielding related systems, apparatuses, and methods are provided herein. According to one example embodiments, a free-space absorber metamaterial is provided. The free-space absorber metamaterial may comprise a first array of patches disposed at a first plane, where each patch in the first array of patches has a first patch area, and each patch in the first array of patches is formed to have a first electrical resistance. Further, the free-space absorber metamaterial may also comprise a conductive backplane disposed at a structural surface plane. In this regard, the first plane and the structural surface plane may be parallel. Additionally, the free-space absorber metamaterial may comprise a first dielectric spacer disposed between the first array of patches and the conductive backplane. In this regard, the first dielectric spacer may have a first width that defines a first gap distance between the first array of patches and the conductive backplane. Further, a first bandwidth of absorption for the free-space absorber metamaterial may be based on the first patch area, the first electrical resistance, and the first gap distance.

According to another example embodiment, a free-space absorber metamaterial structure is provided that may comprise a first array of patches disposed at a first plane, where each patch in the first array of patches has a first patch area, and each patch in the first array of patches is formed to have an electrical resistance. The free-space absorber metamaterial structure may comprise a first dielectric spacer disposed adjacent to the first array of patches. In this regard, the first dielectric spacer may have a first width that defines a first gap distance for the first array of patches. The free-space absorber metamaterial structure may also comprise a second array of patches disposed at a second plane. In this regard, each patch in the second array of patches may have a second patch area that is different from the first patch area. Further, each patch in the second array of patches may be formed to have a second electrical resistance that is different from the first electrical resistance. The free-space absorber metamaterial structure may also comprise a second dielectric spacer disposed between the first array of patches and the second array of patches. The second dielectric spacer may have a second width, and a second gap distance associated with the second array of patches is defined as a combination of the first width and the second width. A bandwidth of absorption for a free-space absorber metamaterial formed using the free-space absorber metamaterial structure may be based on the first patch area, the first electrical resistance, the first gap distance, the second patch area, the second electrical resistance, and the second gap distance.

According to another example embodiment, a metamaterial is provided. The metamaterial may comprise an array of patches disposed at a first plane, where each patch in the array of patches has a patch area. The metamaterial may further comprise a conductive backplane disposed on a structural surface plane. The first plane and the structural surface plane may be parallel. The metamaterial may further comprise a first dielectric disposed between the array of patches and the conductive backplane, where the first dielectric has a first width. The metamaterial may further comprise a plurality of vias disposed within the first dielectric. In this regard, each via in the plurality of vias may electrically connect a respective patch in the array of patches to the conductive backplane. The metamaterial may further comprise a resistive layer having a resistance per unit area, and a second dielectric disposed between the resistive layer and the array of patches. The second dielectric may have a second width. A gap distance for the resistive layer may be a combination of the first width and the second width. A first bandwidth of absorption for the metamaterial may be based on the resistance per unit area and the gap distance for the resistive layer, and an attenuation frequency for the metamaterial may be based on the patch area and a via inductance.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

Figure 27A:
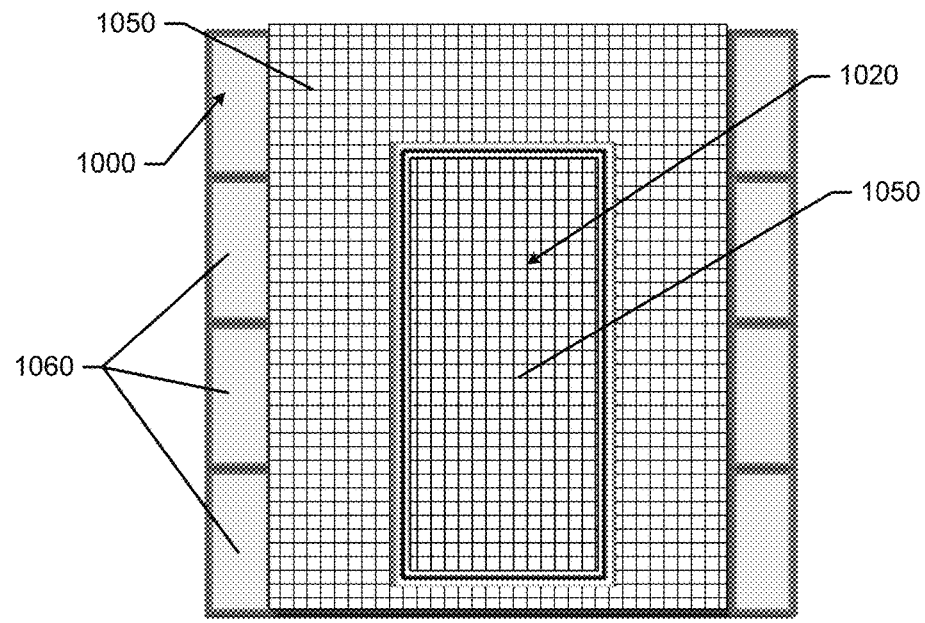
Figure 27B:
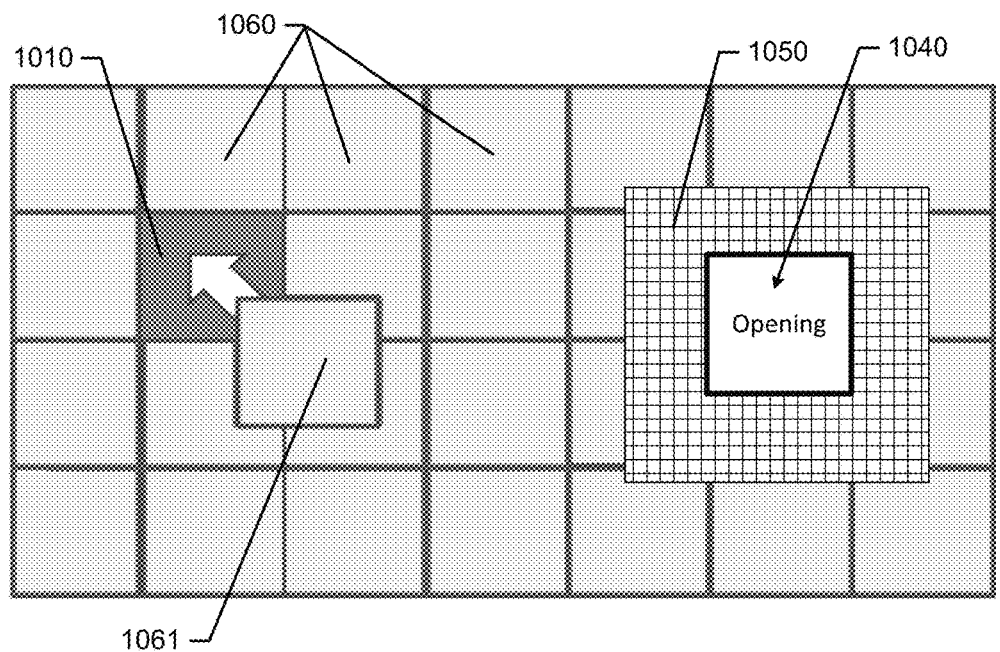

FIG. 27A illustrates a shielded wall with surface wave attenuator metamaterial installed around and on a door and free-space absorber metamaterial installed elsewhere according to some example embodiments; and FIG. 27B illustrates a shielded wall with surface wave attenuator metamaterial installed around an opening and free-space absorber metamaterial installed elsewhere according to some example embodiments.

DETAILED DESCRIPTION

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. As used herein, operable coupling should be understood to relate to direct or indirect connection that, in either case, enables functional interconnection of components that are operably coupled to each other.

Figure 1:
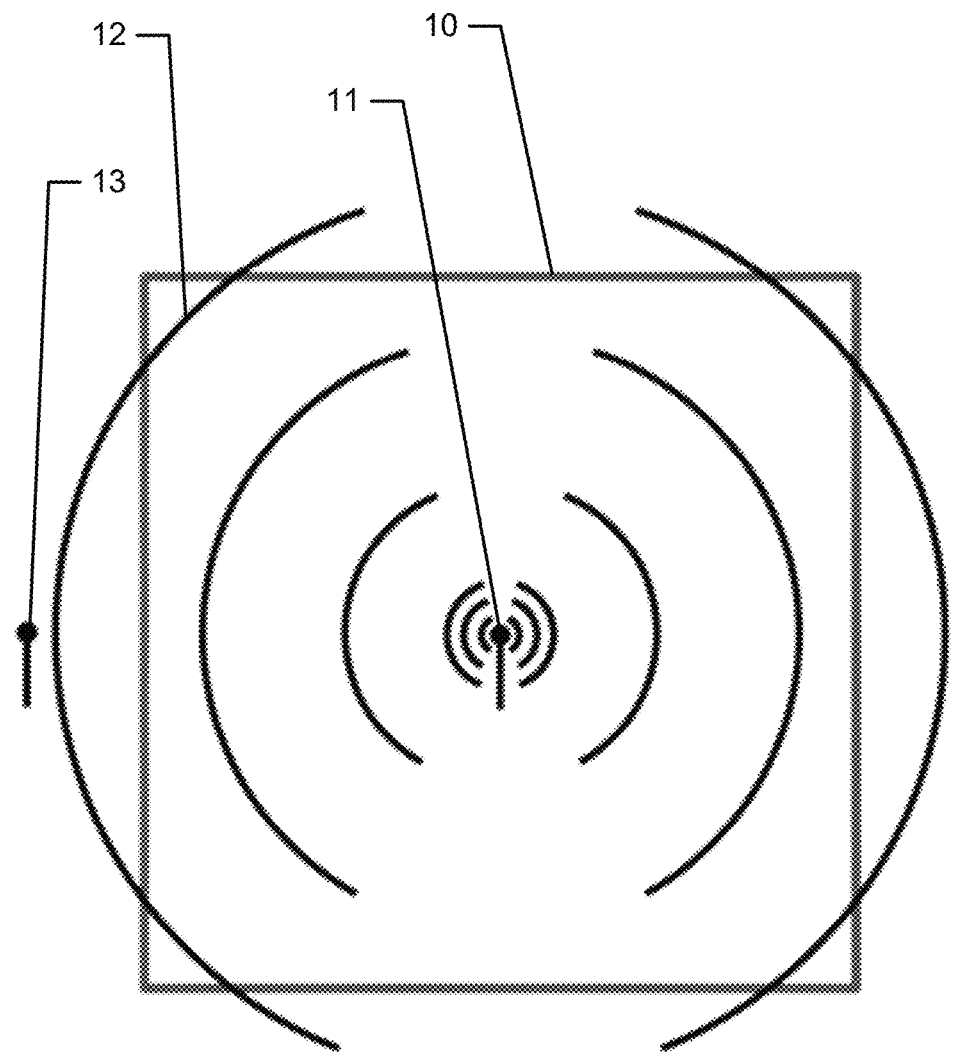
FIG. 1 illustrates an example room with unshielded walls.

As discussed above, taking measures to attenuate radio frequency surface waves and absorb free-space energy can be vital to the construction of electromagnetic interference (EMI) shielded structures (e.g., buildings, rooms, or the like). FIG. 1 shows an example room with unshielded walls 10 and an electromagnetic (EM) energy source 11 disposed within the room. As can be seen, the EM waves 12 output from the energy source 11 simply pass through and penetrate the unshielded walls 10. As a result, the EM waves 12, which may for example include sensitive information, can be received at a receiver 13 that is located outside of the room.

Generally speaking, EM shielding can be required in rooms which contain equipment which generates or utilizes EM energy. As such, in many instances, there is a need to prevent the escape of EM energy generated within a room to, for example, prevent interference with nearby sensitive equipment. As mentioned above, escaping EM energy may also contain information which could be intercepted through eavesdropping. Also, EM energy that penetrates into a room can introduce noise which interferes with sensitive instrumentation within the room, decreasing signal to noise ratios or, in extreme cases, causing damage to sensitive components.

Figure 2:
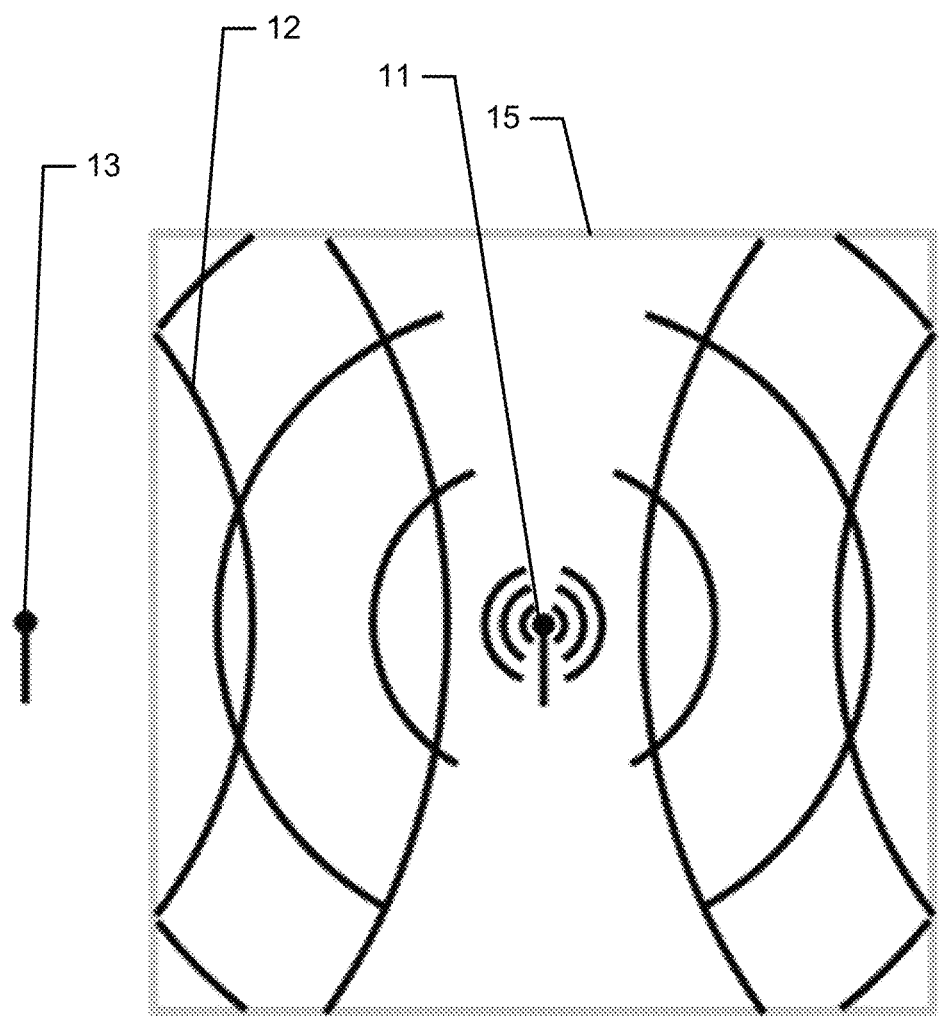
FIG. 2 illustrates an example room with shielded walls according to some example embodiments.

To shield such a space and prevent the propagation of EM waves into or out of a room, Faraday cage shielding may be installed into structural surfaces of the room (e.g., the walls, floors, and ceilings). This may involve completely covering or constructing the structural surfaces of the space with a conductive material such that the room is encased. With this conductive material encasing the room, EM waves may not penetrate into or out of the room. In this regard, FIG. 2 shows an example room with shielded walls 15 using a Faraday cage shielding approach. As can be seen, the EM waves 12 from the energy source 11 do not penetrate the shielded walls 15, and receiver 13 does not receive the energy wave 13.

However, it can also be seen in FIG. 2 that due to the Faraday cage shielding, the EM waves 12 as free-space energy reach the conductive material are reflected back into the room. While leakage of the energy out of the room has been prevented, the energy is essentially trapped within the room and repeatedly reflects back into the space.

The principle of Faraday cage shielding is effective. However, in practice, Faraday cage shielding approaches are not ideal because rooms typically include doors, windows, ventilation openings, and the like that introduce discontinuities (e.g., seams and penetrations) into the shielding. These discontinuities can lead to leakage of the free-space EM waves, particularly since the energy is being reflected back into the space and is therefore more likely to interact with a discontinuity.

Figure 3:
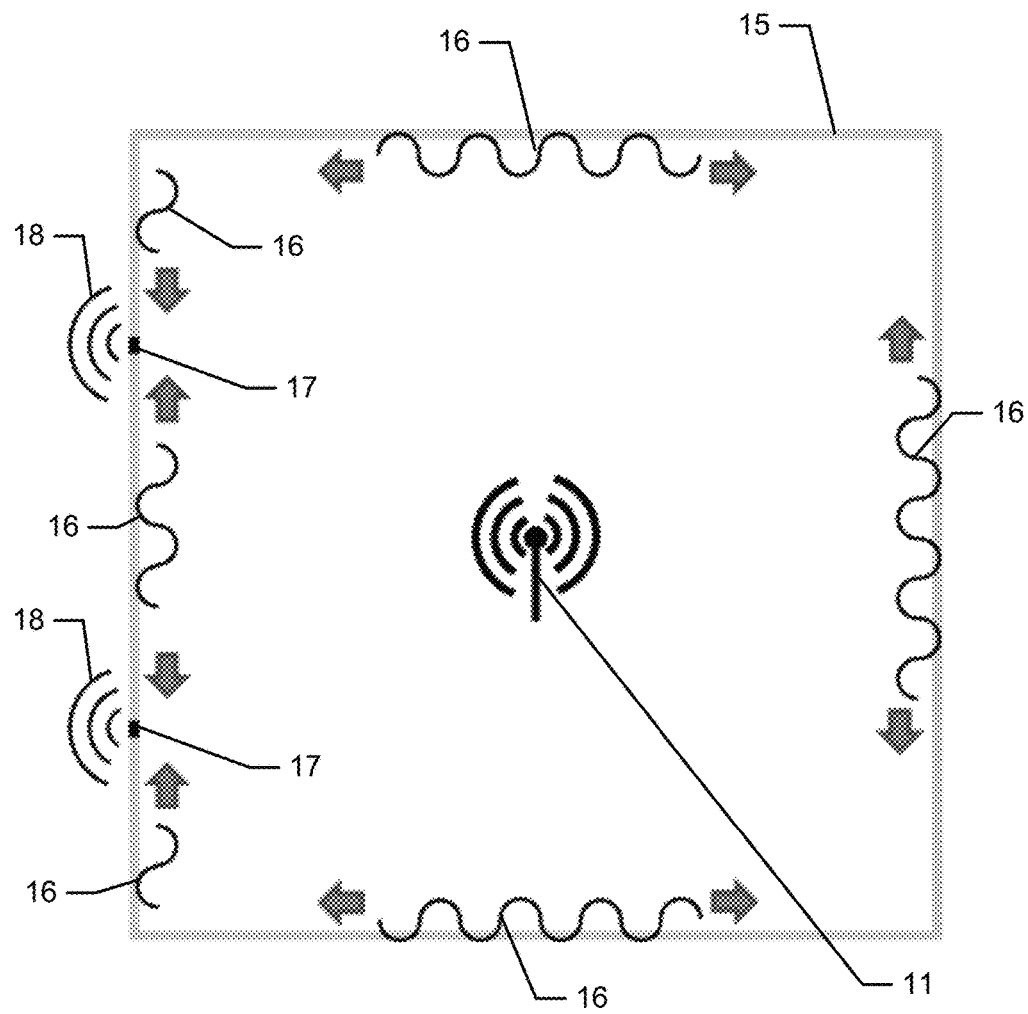
FIG. 3 illustrates an example room with shielded walls with electromagnetic surface waves coupled to the walls according to some example embodiments.

In addition to this drawback with respect to free-space energy, another drawback of Faraday cage shielding is that surface currents or waves can arise and be coupled into the conductive shielding material. With reference to FIG. 3, it can be seen that such surface waves 16 are propagating in an example shielded room along the shielded walls 15. The example room of FIG. 3 includes discontinuities 17 in the shielding. As such, when the surface waves 16 reach these discontinuities 17, the energy in the surface wave 16 can become re-radiated energy 18 out of the shielded room (or into the shielded room). As such, the occurrence of a surface wave as a result of Faraday cage shielding can also pose a technical problem for constructing an effectively shielded environment.

As such, there is a need to inhibit (either through attenuation or absorption) the propagation of EM waves to construct shielded spaces. According to some example embodiments, alternative and supplemental forms of unconventional shielding solutions are provided herein that improve the shielding characteristics relative to mere Faraday cage shielding approaches. These solutions may be implemented in a number settings and applications. In this regard, according to some example embodiments, the solutions provided herein may be applied for EMI shielding in fixed structures such as buildings, in portable or fixed sensitive compartmented information facility (SCIF) rooms, medical facilities, communication facilities, conference facilities, and the like. Accordingly, as described herein, example embodiments are provided that address issues associated with the propagation of surface waves followed by example embodiments that address free-space energy leakage issues. Additionally, some example embodiments, are provided that address both surface waves and free-space energy and offer approaches for implementing such solutions in various environments.

With regard to surface waves, example embodiments may be employed, particularly near a penetration or discontinuity in a surface of the structure (e.g., wall, floor, or the like) to inhibit the propagation and re-radiation of radio frequency surface waves. To properly shield such structures, free-space energy that may be coupled into such surfaces in the form of a surface wave should be prevented from reaching discontinuities (e.g., seams or penetrations), thereby inhibiting the re-radiation of the energy into or out of the space. As mentioned above, such discontinuities often exist near or at doors, windows, ventilation openings, cable pass-throughs, and the like.

According to some example embodiments, engineered surface wave attenuating metamaterials, that operate to attenuate EM surface waves, including radio frequency surface waves, offer one solution for inhibiting re-radiation in such spaces. In this regard, according to some example embodiments, surface wave attenuating metamaterials may, for example, be built using a "mushroom" structure that is generally comprised of a patch that is centrally connected and electrically coupled by a via to a backplane. A dielectric may be disposed between the patch and the backplane. Such a structure can be designed to operate as a resonant circuit, and the structures may be repeated into an array to form a surface wave attenuating metamaterial sheet that can be applied to surfaces to attenuate radio frequency surface waves for a band of frequencies.

A single structure with a patch, via, and backplane may be referred to as a unit cell. Such a unit cell may be repeated to form a two-dimensional array of structures that can be installed on structural surfaces of a building, for example. The area of the patches, the length of the vias, and the period of the unit cell may determine the performance or operating frequencies for the surface wave attenuating structure. In this regard, the period of the cell may be based on the dimensions of the patch. Within the structure, when constructed as an array, capacitances may exist between the patch and the backplane, as well as between other patches. Further, inductances may exist in the via as well as in the patch itself.

An operating frequency of such a resonant structure may be primarily driven by a capacitance and inductance of the structure. In this regard, as design parameters are changed to increase the capacitance or inductance, the resultant operating frequency may decrease. Increasing the inductance increases the circuit bandwidth, while increasing the capacitance decreases bandwidth. Therefore, increasing inductance may be preferred to decrease the operating frequency while maintaining or increasing the bandwidth of operation.

Further, the operating frequency and bandwidth of the structure may be governed by the capacitance formed between patches in an array and the inductance formed by the patches, vias, and backplane. To reach lower operating frequencies, while retaining a useful bandwidth, the inductance can be increased, for example, by adding, magnetic materials to the dielectric or increasing the distance between patch and the backplane (i.e., the thickness of the surface wave attenuating metamaterial). However, as additional magnetic materials are added or the thickness increases, the weight or size of the surface wave attenuating metamaterial increases, both of which are undesirable. For example, using such an approach to reach sub-gigahertz operating frequencies would cause the resulting surface wave attenuating metamaterial to weigh at least 2.5 pounds per square foot (lb/ft$^2$), even if a relatively light polymer is used in the structure. Such a relatively high weight may be problematic and not feasible for many applications.

Further, rather than using magnetic materials in the dielectric, a lighter weight structure could be formed if air were used as the dielectric. However, air has a very low permeability, and therefore use of air as the dielectric would again require the surface wave attenuating metamaterial to be thicker to attain desirable operating frequencies and bandwidth. In this regard, to reach a useful inductance with an air dielectric, based on the mushroom structure described above, the thickness of the structure would be required to be greater than 1 inch. Such a thickness may be problematic and not feasible for many applications. As such, a technical problem in this area of technology is to develop a structure for use in attenuating EM surface waves that exhibits an increased inductance, without the associated drawbacks of being too thick and having relatively high weight.

Another technical problem of the mushroom structure described above can be fabrication of the structure, particularly with respect to the via. Some fabrication processes can require drilling a hole through the dielectric during assembly and plating or sputtering the drilled hole with metal to form the via between the patch and the backplane. Such plating or sputtering often involves metal evaporation or electroplating processes, both of which can be very capital equipment intensive processes. As such, another technical problem exists with developing an approach to forming a via that does not require costly equipment and processes.

According to various example embodiments, a technical solution to the problems described above, as well as other problems, is to employ a via spring in the construction of a surface wave attenuating metamaterial structure that can be used for EM surface wave attenuation. In this regard, the via spring may be disposed between the patch and the backplane to operate as a via. Because the via spring is formed of a conductive material and includes a plurality of turns, the via spring provides the electrical connection between the patch and the backplane, while also introducing inductance into the structure. Accordingly, because of the introduction of the additional inductance, air may also be used as a dielectric, resulting in a relatively thin and light-weight structure for use in an EM surface wave attenuating metamaterial. Further, the via spring may allow for assembly of the structure without requiring holes to be drilled or metal plating or sputtering. Rather, the structure may be assembled by placing the via spring in position with a retainer and allowing for subsequent compression of the via spring between the patch and the backplane to secure the patch, the via springs, and backplane in place. The compressed via spring may also be assembled under compression to apply a force on both the patch and the backplane to form an electrical coupling with both the patch and the backplane. According to some example embodiments, such electric coupling with the via spring may be established through the compression forces only and may not require soldering, welding, otherwise affixing of the via spring to either of the patch or the backplane other than through compression forces provided by the via spring.

Further, the air dielectric may be realized by, for example, using only air in conjunction with a light-weight skeletal support frame or a structural foam comprised primarily of air. In either example approach, the frame or the foam may also operate as a standoff between the patch and the backplane to separate the patch and backplane a desired distance apart. In either example approach, a retainer may be provided in the form of, for example, a structural hole to accurately locate the via spring in the structure and prevent movement of the via spring. In this regard, the retainer may physically couple to at least a side of the via spring to provide physical support to the via spring and maintain the via spring in a position between the patch and the backplane.

According to some example embodiments, the via spring may be provided in the form of a conductive coiled spring. As such, the length, total number of turns, and a diameter of the via spring may determine the inductance that the via spring contributes to the circuit based on the following relationship:

$$L = \frac{\mu_0 * \kappa * N^2 * A}{l}$$

where L is the inductance of the via spring, $\mu_0$ is the permeability of a vacuum, $\kappa$ is the Nagaoka coefficient (a geometric factor based on the cross-sectional area of the via spring and the length of the via spring), N is the number of turns in the via spring, A is the cross-sectional area of the via spring, and l is the length of the via spring. Using this relationship, it can be seen that several hundred nanoHenries (nH) may be introduced by the via spring with a length of approximately 1 centimeter thereby achieving operating frequencies below 1 gigahertz with thickness of 1 centimeter and an air core dielectric for the structure. Thus, according to some example embodiments, a simple conductive coiled spring may be utilized at the via spring.

Further, due to the ease of assembly that is associated with use of the via spring, different spring designs (e.g., springs with different numbers of turns, lengths, or turn radii) may be used to fabricate structures having different inductances and therefore different operating frequencies based on an otherwise standardized structural design. In other words, a further advantage may be, according to some example embodiments, that different via springs may be used to change the surface wave attenuating metamaterial operating frequency by inserting a different via spring into the base structure during fabrication. Accordingly, various different operating frequencies may be achieved by structures through the use of, for example, one backplane, patch design, and foam or skeletal air dielectric to fabricate surface wave attenuating metamaterials with different properties by using different via springs with different structures. Additionally, by, for example, patterning varied via springs into the dielectric material, a graded surface wave attenuating metamaterial structure may also be realized in accordance with some example embodiments. Thus, according to various example embodiments, as further described in more detail below, the via spring allows for the use of air as the dielectric, thereby dramatically reducing the weight and size of a resulting surface wave attenuating metamaterial that can achieve sub-gigahertz surface wave attenuation. According to some example embodiments, a resulting surface wave attenuating metamaterial built using a structure with the via spring can achieve exceptional attenuation performance at, for example, frequencies of 400 megahertz and potentially lower, with a weight of 0.5 lb/ft$^2$ or less, and thicknesses of 1 centimeter or less.

Figure 4:
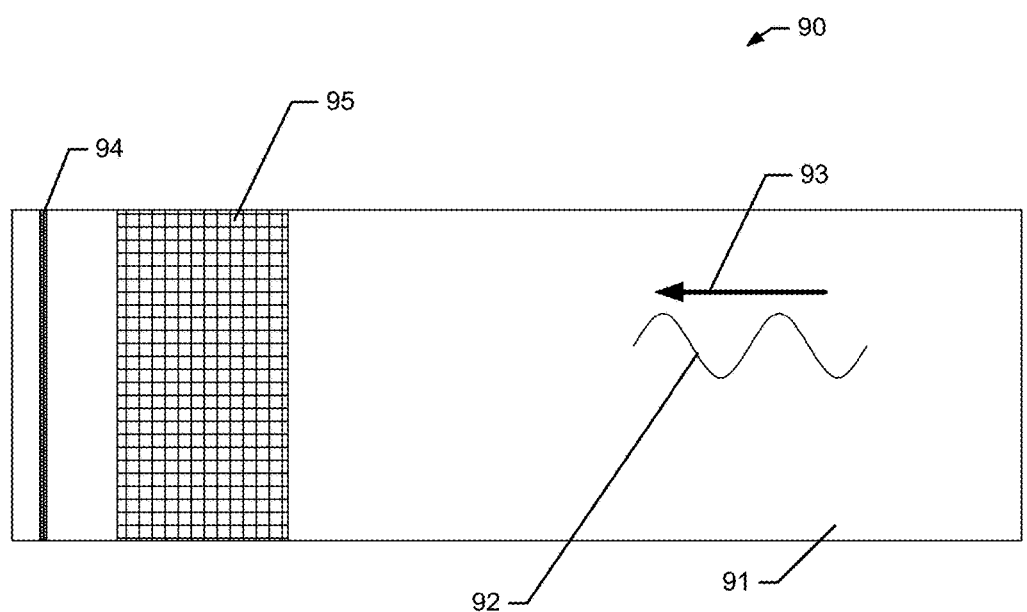
FIG. 4 illustrates an example surface wave propagating across a surface according to some example embodiments.

In light of the forgoing, FIG. 4 illustrates an example space 90 with a structural surface 91 (e.g., a wall) that has been subjected to an EM surface wave 92. In this regard, EM surface wave 30 may be propagating in one or more directions including direction 93 on the surface 91 towards a discontinuity 94 (e.g., a crack in a door frame or window jam). If the EM surface wave 92 were to reach the discontinuity 94, the EM surface wave 92 may be re-radiated into the space 90. However, surface wave attenuating metamaterial 95 which, according to some example embodiments, has been tuned to attenuate waves having the frequency of EM surface wave 92, has been applied to the surface 91 adjacent the discontinuity 94. As such, the EM surface wave 93 is attenuated and the energy of the wave is scattered before the wave 93 can reach the discontinuity 94. Accordingly, electromagnetic interference that could have been released into the space 90 by the EM surface wave 30 is prevented from radiating by operation of the surface wave attenuating metamaterial 95. According to various example embodiments, surface wave attenuating metamaterial 95 may be comprised of any number of surface wave attenuating structures that are formed into an array and provided as a sheet for application to a surface, such as surface 91.

Figure 5:
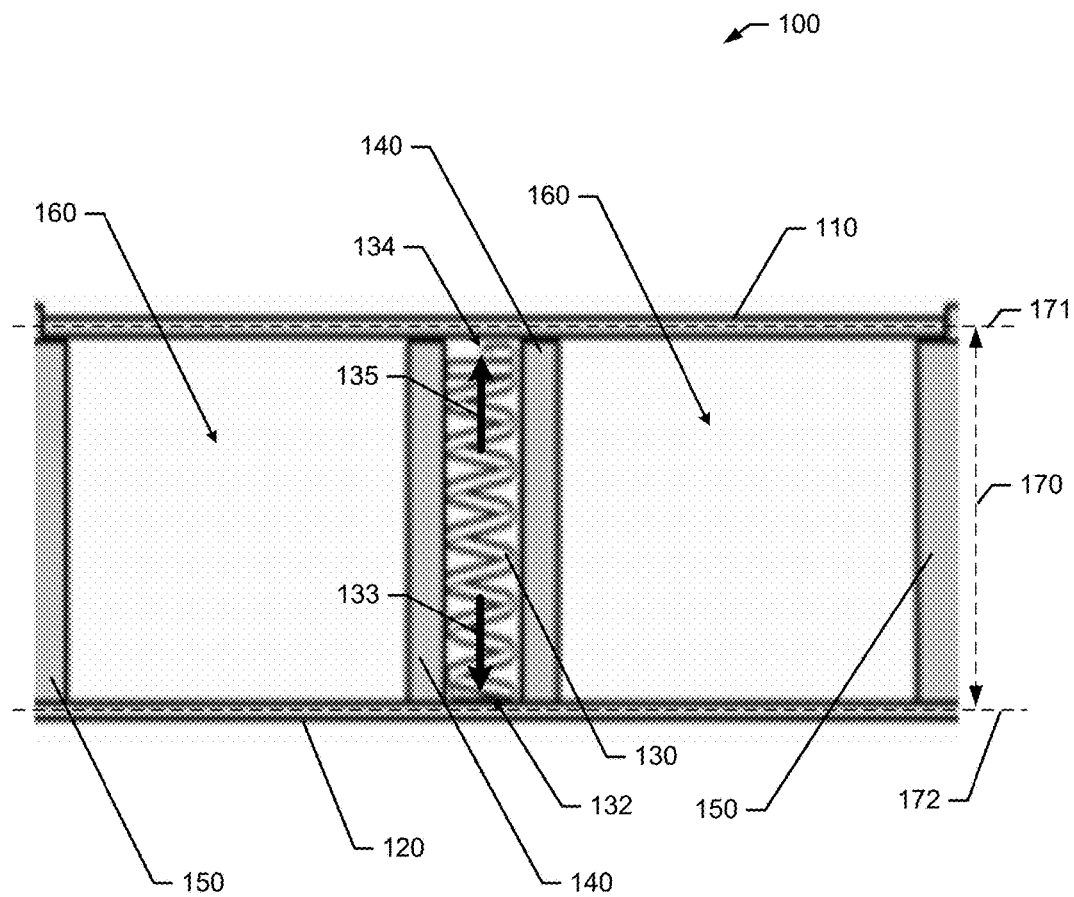
FIG. 5 illustrates a side cross-section view of an example surface wave attenuator structure according to some example embodiments.

FIG. 5 shows a cross-section side view of an example surface wave attenuator structure 100 that is a unit cell, in accordance with some example embodiments. The structure 100 may include a patch 110, a backplane 120, and a via spring 130. The structure 100 may also include a dielectric. As described in further detail below, the structure 100 may be combined with any number of similar surface wave attenuator structures in an array to form a surface wave attenuating metamaterial sheet that may be applied to various surfaces.

The patch 110 of the structure 100 may be formed of any type of conductive material and may be shaped as, for example, a flat plate. In this regard, the cross-section view of FIG. 5 shows patch 110 as a flat plate, but the top and bottom surfaces of the patch 110 may take a broader geometric shape such as a square, rectangle, circle, oval, triangle, or the like. Each structure 100 may include a dedicated patch 110 that is physically isolated from the patches of other structures in an array by, for example, a gap or a post. The patch 110 may be disposed on what may be considered a top side of the structure 100 for reference purposes.

Further, the patch 110 may be disposed along a first plane 171 of the structure 100. Patch 110 may be operably coupled to non-conductive standoffs 150 at least at some edges or other portions of the patch 110. According to some example embodiments, the patch 110 may be affixed (using adhesives, fasteners, or the like) to the standoffs 150 to hold the patch 110 in place, after assembly of the structure 100 is complete. Further, patch 110 may also be operably coupled to the retainer 140, which may take the form of, for example, a tube. Additionally, the patch 110 may be electrically coupled to the via spring 130 as further described herein.

The structure 100 may also include a conductive backplane 120, which may disposed on a bottom side of the structure 100 (opposite the patch 110). The conductive backplane 120 may comprised of a conductive material and may also be formed as a flat plate. According to some example embodiments, the conductive backplane 120 may extend to the edges of an array of structures 100 and therefore the conductive backplane 120 extend such that the conductive backplane 120 is shared amongst a number of structures 100. The conductive backplane 120 may be disposed along a second plane 172, which, according to some example embodiments, may be parallel to first plane 171. As such, the conductive backplane 120 may be parallel to patch 110, thereby, according to some example embodiments, forming parallel plates. Further, according to some example embodiments, the conductive backplane 120 may be part of a Faraday shielding material for a shielding implementation. As such, according to some example embodiments, the structure 100 may be fabricated without the conductive backplane 120, and the conductive backplane 120 may become a component of a structure when the structure is installed onto a structural surface that has been covered with conductive material.

Conductive backplane 120 may be operably coupled to non-conductive standoffs 150 on a bottom side of the standoffs 150. As such, standoffs 150 may define a distance 170 between the patch 110 and the conductive backplane 120, and a capacitance of the structure 100 may be based on the distance 170. According to some example embodiments, the conductive backplane 120 may be affixed (using adhesives, fasteners, or the like) to the standoffs 150 to hold the conductive backplane 120 in place after assembly of the structure 100 is complete. Further, conductive backplane 120 may also be operably coupled to the retainer 140. Additionally, the patch 110 may be electrically coupled to the via spring 130 as further described herein.

The structure 100 may also include the via spring 130, which operates to electrically couple the patch 110 to the conductive backplane 120. The via spring 130 may be a coil spring having a number of turns and formed of a conductive material. As mentioned above, the attributes of the via spring 130 can cause the via spring 130 operate in both an electrical and mechanical role in the structure 100. In this regard, due to the number of turns, the cross-sectional area of the turns, and a length (e.g., distance 170) of the via spring 130, the via spring 130 may operate, electrically, as an inductor in the resonant circuit of the structure 100 thereby introducing inductance into the circuit. Additionally, the via spring 130 may operate, mechanically, in response to being placed under compression, to form strong physical connections to both the patch 110 and the backplane 120 to generate reliable electrical connections with the patch 110 and the backplane 120. It is contemplated that the physical coupling between the via spring 130 and either or both of the patch 110 and the backplane 120 may be indirect such that an intermediate conductive member could be included on either or both ends of the via spring 130 to thereby create a similar physical coupling without direct contact between the via spring 130 and the patch 110 or the backplane 120.

In this regard, the via spring 130 may be disposed between the patch 110 and the backplane 120. A retainer 140, which in this case may be formed as a tube, may operate to physically hold the via spring 130 in place between the patch 110 and the backplane 120, by, for example, physically coupling with a side or sides of the via spring 130. The via spring 130 may be disposed such that a center axis of the via spring 130 (i.e., central to the turns of the via spring 130) may be orthogonal or substantially orthogonal to the patch 110 and the backplane 120. Further, the center axis of the via spring 130 may be aligned with a center point of the shape of the patch 110 (e.g., center of the circle, square, rectangle, etc.).

As mentioned earlier, the via spring 130 may be mechanically compressed during assembly between the patch 110 and the conductive backplane 120 of the structure 100. Due to this compression, a patch force 135 may be applied on the patch 110 by the via spring 130. However, since the patch 110 may be affixed (using adhesives, fasteners, or the like) to the standoffs 150, the patch 110 may remain stationary despite the force 135 being applied by the via spring 130. As such, a physical and electrical compression connection 134 between the via spring 130 and the patch 110 may be formed. According to some example embodiments, only the force 135 may be needed to form the connection 134 and no welding or soldiering may be required, although welding and soldiering could be utilized if desired. As such, according to some example embodiments, via spring 130 may not be affixed to the patch 110 but may remain in operable coupling with the patch 110 due to the compression of the via spring 130 and the operation of the retainer 140 to hold the via spring 130 in position.

Additionally, due to the compression of the via spring 130, a backplane force 133 may be applied on the conductive backplane 120 by the via spring 130, but since the conductive backplane 120 may be affixed (using adhesives, fasteners, or the like) to the standoffs 150, the conductive backplane 120 may remain stationary despite the force 133 being applied by the via spring 130. As such, a physical and electrical compression connection 132 between the via spring 130 and the conductive backplane 120 may be formed. According to some example embodiments, only the force 133 may be needed to form the connection 132 and no welding or soldiering may be required, although welding and soldiering could be utilized if desired. As such, according to some example embodiments, via spring 130 may not be affixed to the backplane 120 but may remain in operable coupling with the backplane 120 due to the compression of the via spring 130 and the operation of the retainer 140 to hold the via spring 130 in position.

The structure 100 may also include dielectric cavities 160 within which a dielectric may be disposed. The dielectric cavities 160 may be disposed adjacent to the via spring 130 and between the patch 110 and the conductive backplane 120. In this regard, according to some example embodiments, the dielectric cavities 160 may retain a dielectric or dielectric material that supports the electrical operation of the structure 100. According to some example embodiments, the dielectric cavities 160 may retain air as the dielectric. In this regard, according to some example embodiments, the dielectric cavities may be filled with various percentages of air such as more than 50% of the dielectric cavities 160 may be filled with air, more than 75% of the dielectric cavities 160 may filled with air, or the like. According to some example embodiments, other light-weight materials, possibly in the form of gases, may be retained in the dielectric cavities 160 to operate as the dielectric. In some example embodiments, the dielectric cavities 160 may be filled a foam that encapsulates air in small pockets or bubbles in the foam.

The retainer 140 and the standoffs 150 may be formed in a variety of ways according to some example embodiments. In this regard, the retainer 140 and standoffs 150 may be formed of a non-conductive, insulator material. The retainer 140 and the standoffs 150 may generally function to provide structural support to the components of the structure 100. As such, the retainer 140 and the standoffs 150 may be formed in any manner to provide this structural support function. Accordingly, the retainer 140 may be formed as a channel in a foam dielectric, where the via spring 130 is placed in a channel. The channel would therefore operate to support the via spring 130 by operably coupling with the sides of the via spring 130. Further, rather than the retainer 140 receiving the via spring 130 in channel, as in the cases of the tube or the channel, the retainer 140 may include one or a set of complementary posts that are disposed in the center of the via spring 130 to hold the via spring 130 in place. Further, the retainer 140 need not extend the entire distance between patch 110 and the conductive backplane 120. Rather, according to some example embodiments, the retainer 140 may be a ring that does not extend from the patch 110 to the conductive backplane 120 and may be operably coupled to the standoffs 150 to hold the via spring 130 in place between the patch 110 and the conductive backplane 120. As such, the retainer 140 may generally operate to physically couple to at least a side of the via spring 130 to provide physical support to the via spring 130 and maintain the via spring 130 in a position between the patch 110 and the backplane.

Similarly, the standoffs 150 may be embodied in a number of ways while providing the functions of providing a member to which the patch 110 and the conductive backplane 120 may be affixed in the structure 100 and defines the distance 170 between the patch 110 and the conductive backplane 120. As such, according to some example embodiments, the retainer 140 and the standoffs 150 could be an integrated member, for example, in the form of a tube that extends from the conductive backplane 120 to the patch 110 and includes top and bottom surfaces to facilitate affixing the patch 110 to the top surface of the tube and the bottom surface of the tube (while also retaining the via spring 130 in the interior of the tube). Further, in an example embodiment where the dielectric cavities 160 are filled with a foam that becomes rigid, the standoffs 150 may be the structure of the foam, where the foam is provided to have a height to create the desired distance 170 between the patch 110 and the conductive backplane 120.

As described above, the structure 100 operates, electrically, to attenuate EM surface waves of a certain frequency and bandwidth. To do so, the structure 100 electrically forms a resonant circuit with capacitance and inductance parameters. The capacitance may be based on, and a function of, the area of the patch 110 and the distance 170 between the patch 110 and the conductive backplane 120, which introduce capacitance into the resonant circuit by operating as a parallel plate capacitor with a dielectric disposed there between. Further, the inductance of the resonant circuit may be based on, and a function of, the parameters of the via spring 130 (i.e., the number of turns, the radius of the turns, and the length of the via spring 130) as well as other aspects of the structure 100.

Figure 6A:
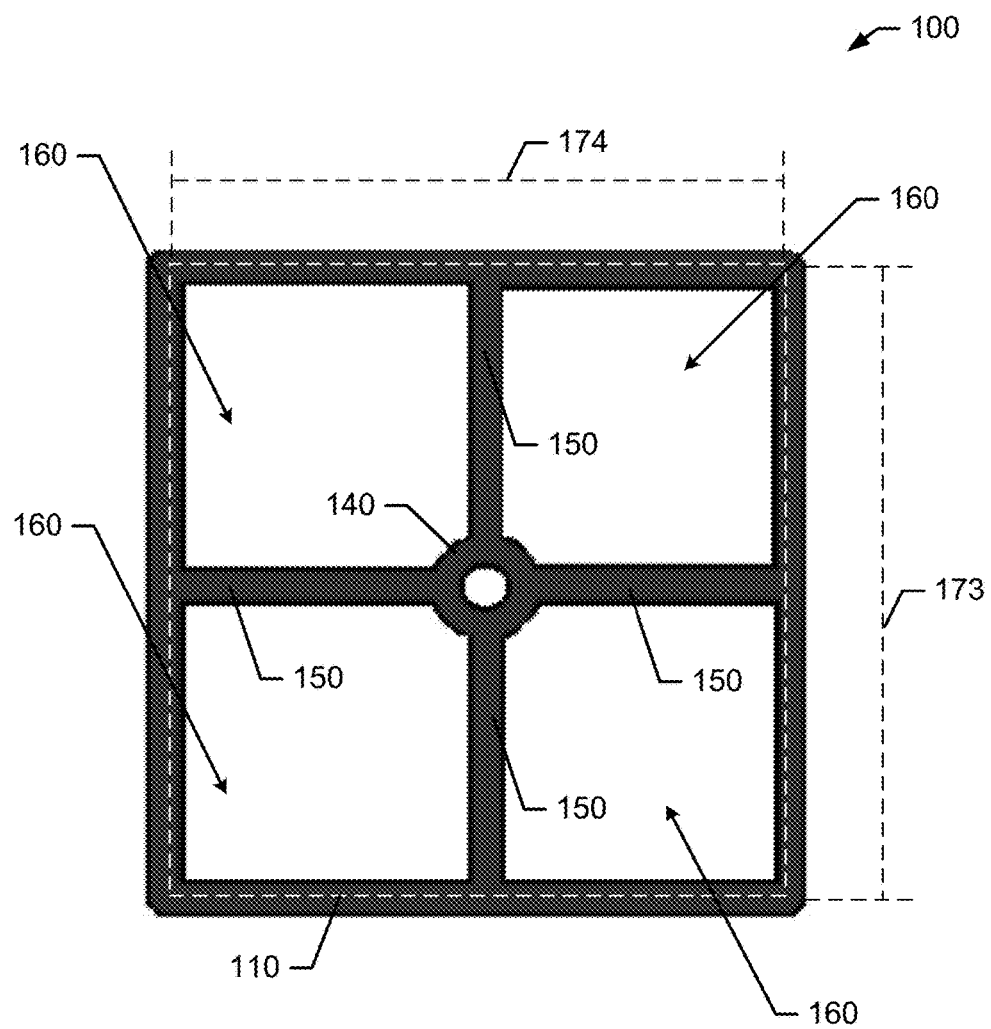
FIG. 6A illustrates a top view of some components of an example surface wave attenuator structure including a frame according to some example embodiments.

FIG. 6A provides a top view of some components of a structure 100 where the standoffs 150 and retainer 140 are part of a frame which may be formed of, for example, injection molded plastic. In this regard, patch 110 is shown as having a square shape with dimensions 173 and 174 to define an area of the patch 110. Further, the retainer 140 is formed as a tube with an internal space for receiving the via spring 130 (not shown in FIG. 6A). The retainer 140 may be integrated with standoffs 150, which also physically couple the retainer 140 to the exterior frame. The frame may be one unit of a larger frame used to form a surface wave attenuating metamaterial. The patch 110 and the backplane 120 may be affixed to the standoffs 150 or the top and bottom edges of the retainer 140.

Figure 6B:
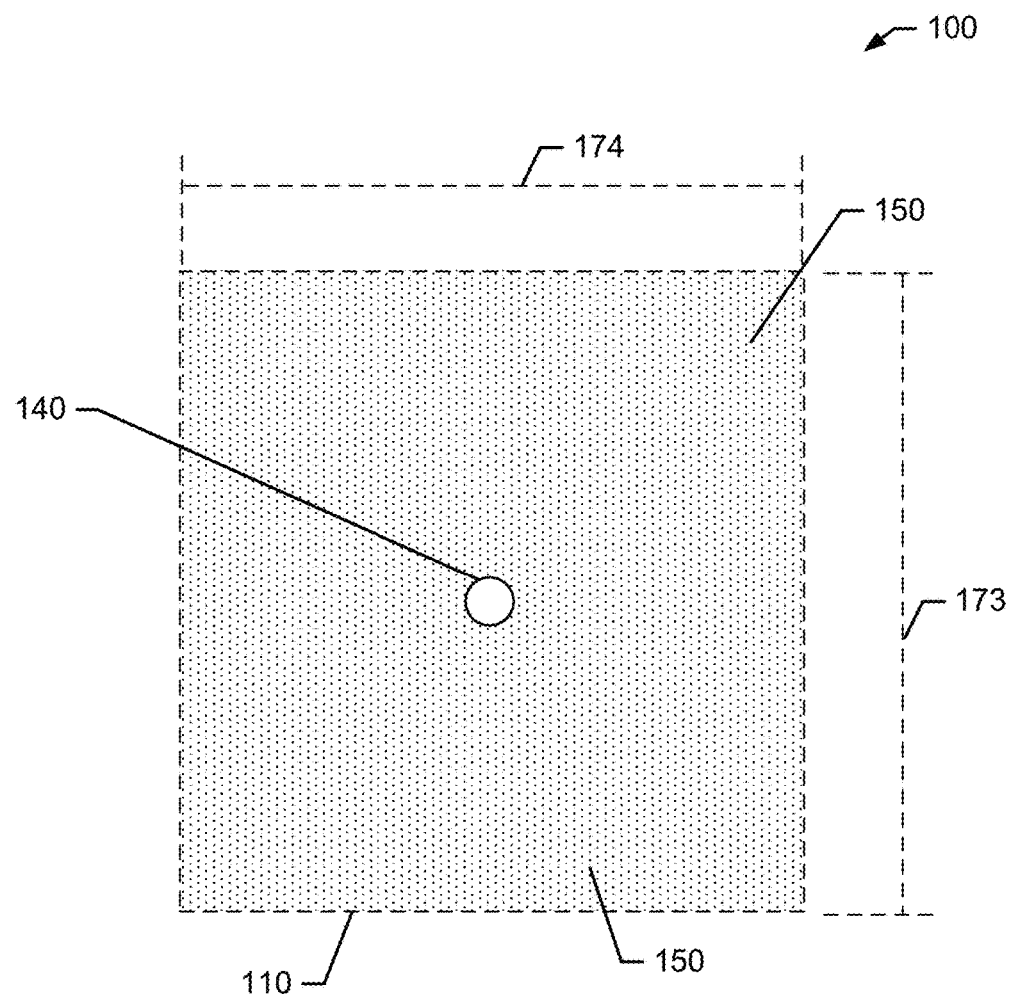
FIG. 6B illustrates a top view of some components of an example surface wave attenuator structure including foam according to some example embodiments.

FIG. 6B provides a top view of some components of another structure 100 where the standoffs 150 and retainer 140 are integrated into a foam 180 that has cured into a rigid form. In this regard, while FIG. 5 shows only one representative structure 100, flowable foam forming air pockets or bubbles may be released into a mold to form a sheet that can be used to assemble a number of structures 100. The foam 180 may cure and harden to provide structural support for affixing the patch 110 and the conductive backplane 120 (not shown in FIG. 6B) to form a structure 100. A channel for receiving the via spring 130 (not shown in FIG. 6B) may be created in the foam 180 to form the retainer 140, which may be formed as part of the mold or by cutting or drilling a hole after the foam 180 has cured. The rigid structure of the foam 180, having a defined height, may form the standoffs 150 and thus define the spacing between the patch 110 and the backplane 120. Again, patch 110 is shown as having a square shape with dimensions 173 and 174 to define an area of the patch 110.

Figure 7:
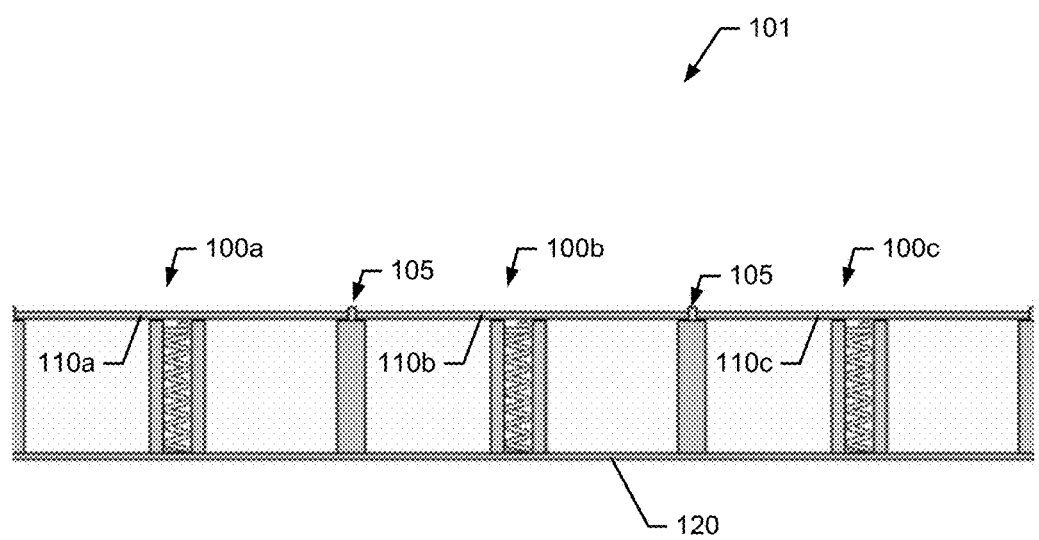
FIG. 7 illustrates a side cross-section view of an example array of surface wave attenuator structures according to some example embodiments.

Having described a singular building-block structure 100 for surface wave attenuation, FIGS. 7 and 8 will now be described which employ the example structure 100 in an array of structures that operate together to form a surface wave attenuating metamaterial and attenuate EM surface waves as a larger sheet. In this regard, FIG. 7 shows a cross-section view of a surface wave attenuating metamaterial 101 with three example structures 100a, 100b, and 100c, having patches 110a, 110b, and 110c, respectively. As shown in FIG. 7, the patches 110a, 110b, and 110c are physically isolated from each other by gaps 105, which may be formed by a respective post on a standoff. Additionally, it can be seen that conductive backplane 120 may extend to and is therefore shared by each of the structures 100a, 100b, and 100c. One of skill in the art would appreciate that while FIG. 7 shows only three structures 100a, 100b, and 100c, a two dimensional array of structures may be constructed with additional adjacent structures that may or may not be viewable in the cross-section shown in FIG. 5 due to their position.

Figure 8:
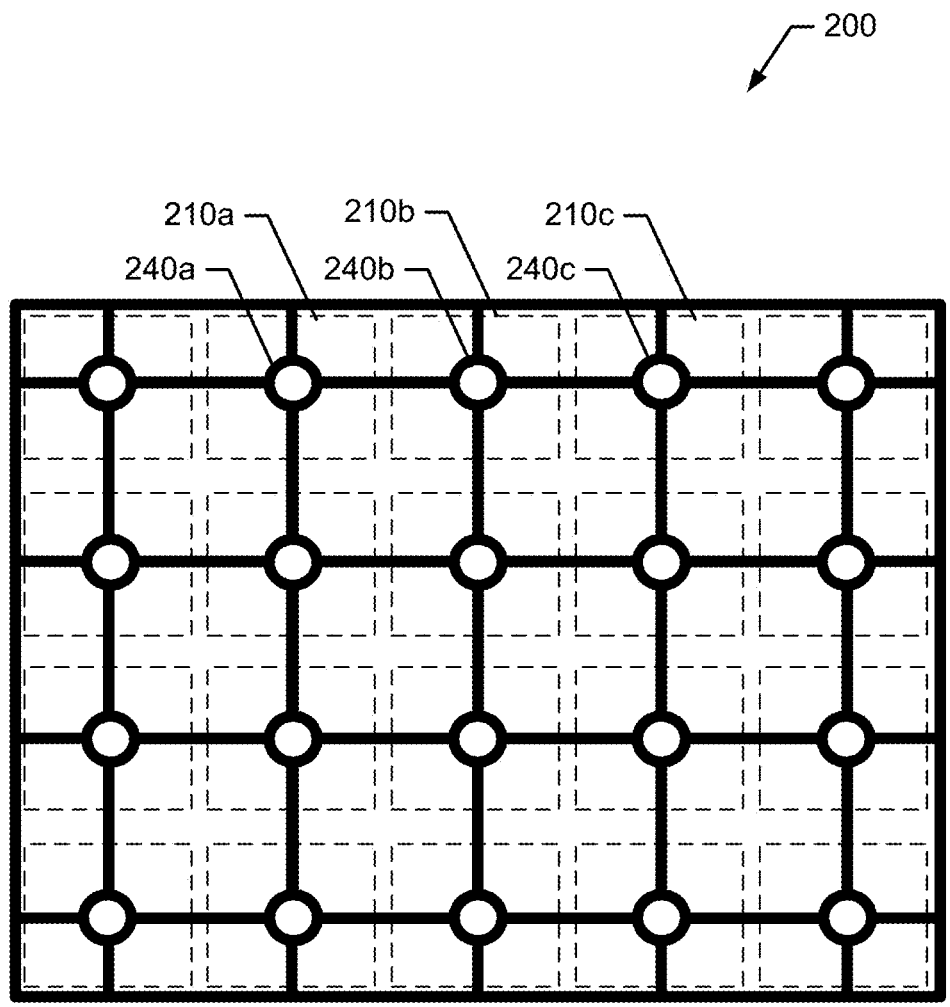
FIG. 8 illustrates a top view of some components of an example array of surface wave attenuator structures according to an example embodiment.

FIG. 8 shows a top view of another surface wave attenuating metamaterial 200, where a two dimensional array of structures can be seen. In this regard, the surface wave attenuating metamaterial 200 may obtain structural support from a frame similar to that shown in FIG. 6A. The surface wave attenuating metamaterial 200 is depicted as a 4×5 array of structures, but one of skill in the art would appreciate that any size n×m array could be constructed to form the surface wave attenuating metamaterial 200. To provide context, the frame of the surface wave attenuating metamaterial 200 may include example retainers 240a, 240b, and 240c for receiving a respective via spring 130 (not shown). Further, each of the associated structures includes a patch 210a, 210b, and 210c, respectively.

Figure 9:
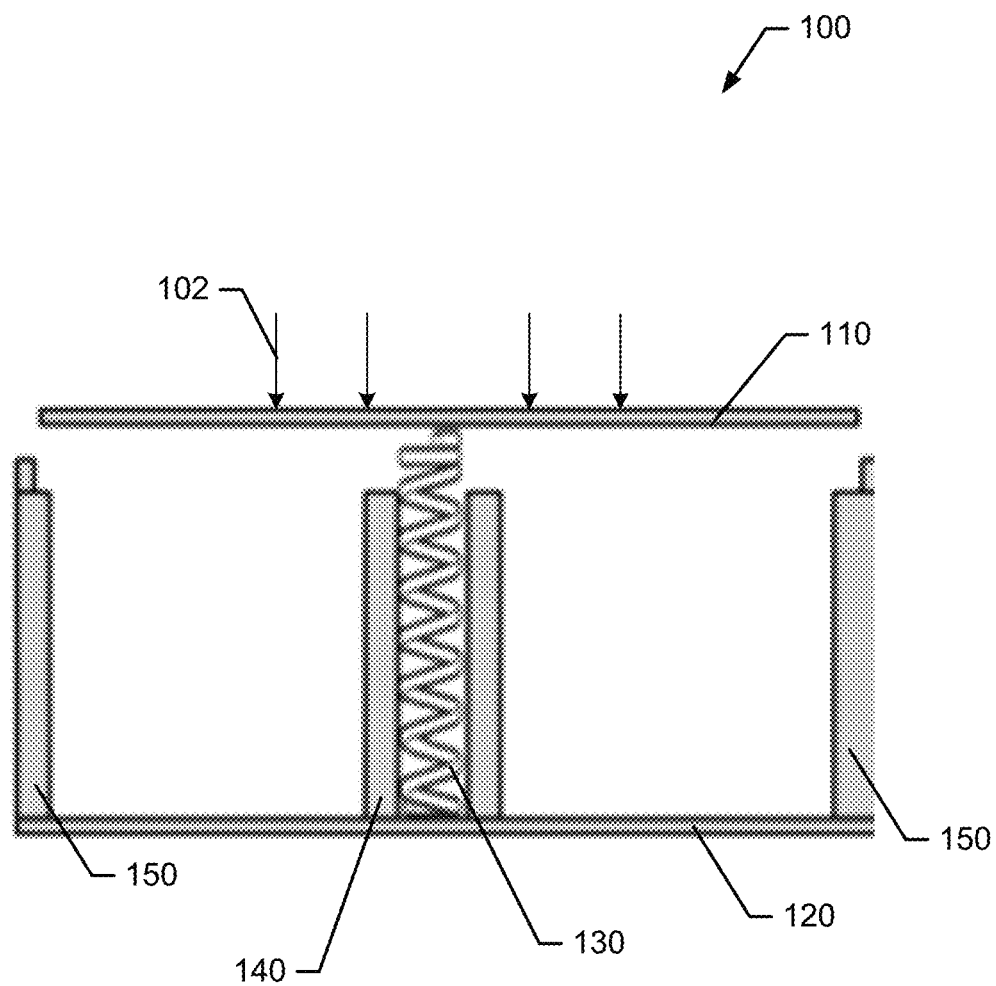
FIG. 9 illustrates a side cross-section view of an example surface wave attenuator structure during assembly according to some example embodiments.

Having described various structures for use as surface wave attenuators, FIGS. 9 and 10 will now be described with respect to assembly of such structures to highlight the advantages of using, for example, a via spring, such as the via spring 130 described herein. In this regard, FIG. 9 shows the structure 100 in the process of being assembled. At this point, the conductive backplane 120 has been affixed to the standoffs 150 (using, for example, adhesives, fasteners, or the like) and the via spring 130 has been placed in the internal opening of the retainer 140. However, the via spring 130 is not yet under compression. The patch 110 may be placed on the via spring 130 and a force 102 may be applied to the patch 110 move the patch 110 into position to affix the patch 110 to the standoffs 150 and compress the via spring 130 (as shown in FIG. 5). As such, due to the compression of the via spring 130, strong physical coupling is formed between the via spring 130 and both the patch 110 and the conductive backplane 120, thereby forming reliable electrical coupling as well, without the need to affix the via spring 130 to the patch 110 or the conductive backplane 120, according to some example embodiments. While this process of compressing the via spring 130 is shown as the patch 110 being the affixed to the standoffs 150 after the backplane 120 is affixed to the standoffs 150, it is contemplated that a process could be used where the patch 110 is affixed to the standoffs 150 first, the via spring 130 is inserted from the bottom into the retainer 140, and then the force is applied to the backplane 120 to compress the via spring 130 and affix the conductive backplane 120 to the standoffs 150.

Figure 10:
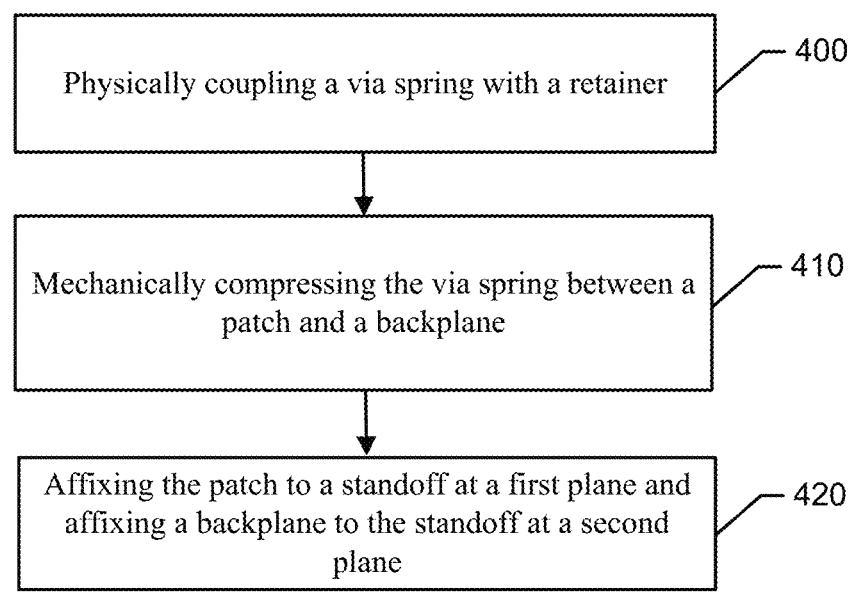
FIG. 10 illustrates a flowchart of an example method for assembling a surface wave attenuator structure according to some example embodiments.

Now with reference to FIG. 10, a flowchart of an example method for assembling a radio frequency surface wave attenuator is provided. Note that it is contemplated that the following operations are not necessarily conducting in the stated order, but could be conducted in a different order. In this regard, at 400, the example method may include physically coupling a via spring with a retainer. The via spring may have a number of turns and the via spring may be comprised of a conductive material. Further, an inductance of the structure being assembled may be based on the number of turns in the via spring. The example method may further comprise, at 410, mechanically compressing the via spring between a patch and a conductive backplane. In this regard, the patch and the backplane may comprise a conductive material and the patch may define a patch area. Further, a capacitance of the structure may be based on the patch area. Additionally, the example method may include, at 420, affixing the patch to a standoff at a first plane and affixing a backplane to the standoff at a second plane. The via spring may be disposed between the patch and the conductive backplane and maintained in position by the retainer. The via spring may be under compression thereby exerting a patch force in a direction of the patch to cause electrical coupling between the patch and the via spring. Further, compression of the via spring may exert a backplane force in a direction of the conductive backplane to cause electrical coupling between the conductive backplane and the via spring. Additionally, the first plane may be substantially parallel to the second plane and the capacitance of the structure may be based on a distance between the first plane and the second plane. Further, the attenuation frequency for the structure may be is based on the capacitance and inductance of the structure. Additionally, according to some example embodiments, the example method may include forming the standoff of an insulating material such that the standoff is physically coupled to the retainer. The standoff may be part of a frame that additionally has positions for a plurality of radio frequency surface wave attenuator structures to be assembled in association therewith.

Having described some example embodiments of a surface wave attenuator metamaterial, additional example embodiments of a surface wave attenuator metamaterial will now be described that employ a different approach in association with a novel and unconventional structure and fabrication process or method. In this regard, an example method, according to some example embodiments, may allow for the fabrication of surface wave attenuator metamaterials for large-scale applications. The example method may utilize, for example, three-dimensional (3D) printing and electroless plating techniques to create monolithic metamaterial tiles, thereby recognizing advantages in detail, weight, cost, and ease of installation.

In this regard, a surface wave attenuator metamaterial may be constructed that is based on the "mushroom" structure described above. With respect to fabrication of surface wave attenuator structures, one challenge of the mushroom structure is the fabrication of the via. Fabrication of the patch and the backplane are planer operations that can lend to fabrication using a layered sheet processes. However, the fabrication of the via is more difficult because the vias are oriented perpendicular to the patch and the backplane, which can require use of a different fabrication process.

Additionally, the weight and cost of shielding systems can also be constraints that must often be considered in a fabrication approach. In this regard, the use of air as a dielectric can operate to support both of these constraints by reducing cost and weight of the fabricated material. However, the use of air as the dielectric also requires open space to be present on the sides of the vias, which can complicate the fabrication process because no structural component such as a hole to be plated through is present to support or form the vias.

To overcome these and other constraints and complexities, a surface wave attenuator metamaterial and associated fabrication process is provided that simplifies the fabrication of the vias, while still using air as the dielectric. In this regard, according to some example embodiments, the conductive portions of the surface wave attenuator metamaterial may be constructed using plated metals or polymers, which can operate to dramatically reduce the weight of the metamaterial, relative to conventional solutions.

Figure 11A:
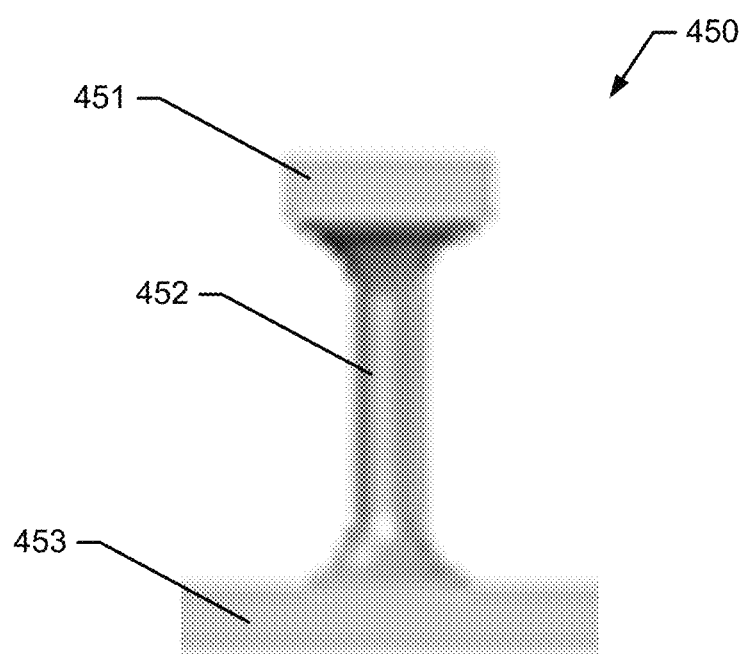
FIG. 11A illustrates a side view of a surface wave attenuator structure according to some example embodiments.
Figure 11B:
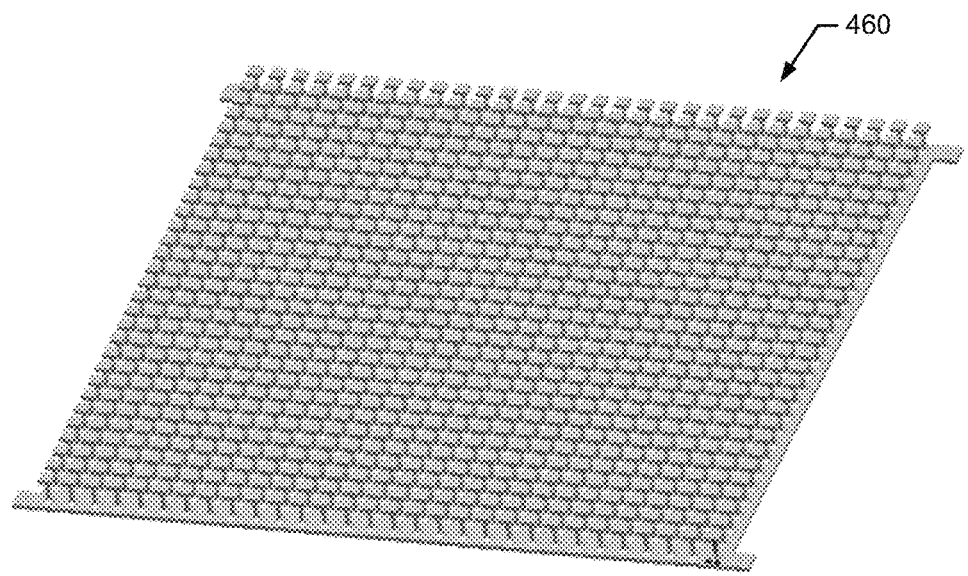
FIG. 11B illustrates a top perspective view of an array of surface wave attenuator structures according to some example embodiments.
Figure 11C:
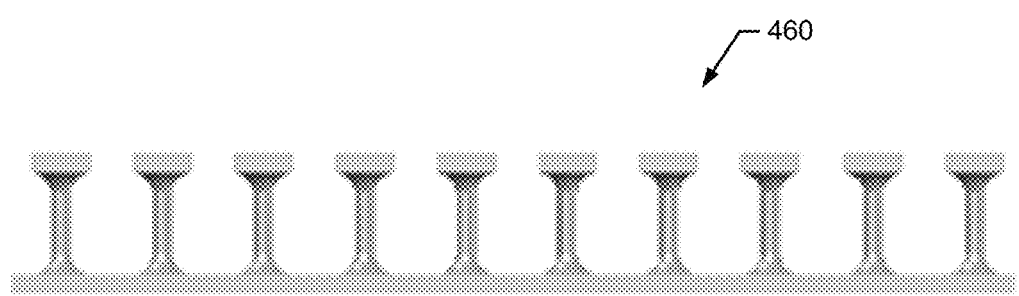
FIG. 11C illustrates a side cross-section view of an array of surface wave attenuator structures according to some example embodiments.

In this regard, an example surface wave attenuator structure 450 that may be fabricated in accordance with the processes described below is shown in FIG. 11A. The structure 450 includes a patch 451, a via 452, and a backplane 453. Similar to the corresponding components of the structure 100, the patch 451 may be connected to the backplane 453 by the via 452. The construction of this surface wave attenuator structure 450 may be repeated to form a two-dimensional array of surface wave attenuator structures that form a surface wave attenuator metamaterial 460 as shown in FIG. 11B. In this regard, FIG. 11B shows a top perspective view of the metamaterial 460, while FIG. 11C shows a cross-section side view of a portion of the surface wave attenuator metamaterial 460. The surface wave attenuator metamaterial 460 may operate the same or similar to the surface wave attenuator metamaterials described above, despite being fabricated differently, as described below.

Figure 12:
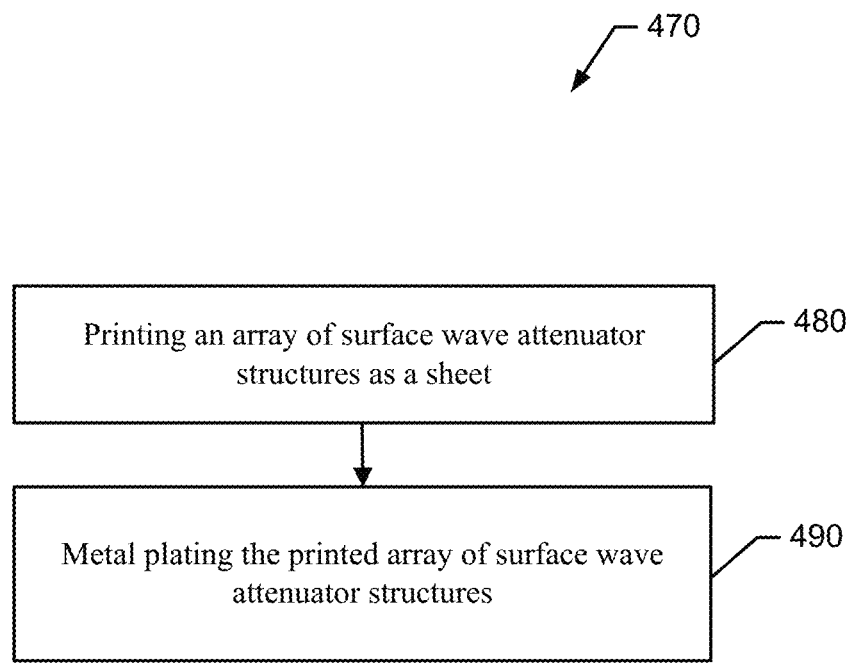
FIG. 12 illustrates a flowchart of an example method for fabricating a surface wave attenuator metamaterial according to some example embodiments.

An example fabrication method 470 for constructing the surface wave attenuator metamaterial 460 is provided in FIG. 12. In this regard, the example method may include printing an array of surface wave attenuator structures 450 as a sheet. The printing may be performed as 3D printing. The printing process may begin by printing the backplane 453 then, building on the backplane 453, the via 452 may printed. The patch 451 may then be printed on the via 452. To provide structural support and to support the process of 3D printing, the via 452 may broaden out at the connection to the backplane 453 and the connection to the patch 451. Additionally, the printing process may be a selective laser sintering (SLS) process that uses sintered powdered material to form the structures 450. The material used for the printing process may be, for example, plastic, metal, ceramic, glass, or the like.

The example fabrication method 470 may continue at 490 where the printed array of surface wave attenuator structures may be metal plated. In this regard, an electroless plating process may be used. Accordingly, since the backplane 453, the via 452, and the patch 451 may all be comprised of conductive materials for the surface wave attenuator metamaterial to operate, metal plating may be applied to all of these components, thereby simplifying the fabrication method. The conductive metal that may be used in the metal plating process may be copper, according to some example embodiments. Further, according to some example embodiments, a thickness of the plated metal may be approximately 1 micron. Additionally, according to some example embodiments, the initial metal plating process may be followed by the application of a thin layer (e.g., approximately 0.25 micron) of nickel to the array of surface wave attenuator structures to provide environmental stability. In this regard, the nickel may also be applied using a metal plating technique such as electroless plating.

The example fabrication method described above can realize several advantages over conventional methods. For example, the use of 3D printing to form the array of surface wave attenuator structures can allow for the construction of unusual shapes (e.g., the mushroom shape) that are not readily cast or otherwise practical using injection molding techniques. Further, the resultant structure may be formed as a monolithic metamaterial. Also, the patch thickness can be readily controlled allowing for carefully tuned inter-patch capacitances and thus greater design control. Further, since the printing media may be relatively lightweight, the overall weight of the metamaterial may be substantially reduced relative to conventional metamaterials. Additionally, the use of electroless plating can allow for highly controlled conductor thickness, which again operates to minimize weight as well as material costs. Finally, since vertical features such as the via may be metal coated and since the backplane may be integrated into the resulting metamaterial, fabricated tiles may be formed. Such tiles may be used to provide both Faraday cage shielding and surface wave attenuation in a single installable tile, which dramatically simplifies installation and in-field repair of existing installations.

While the example embodiments described above may be useful, in particular, for attenuating surface waves, additional example embodiments, which may be used as a supplement to or integrated with the example embodiments above, may be leveraged to increase the shielding effectiveness of structures to inhibit incident free-space energy. As mentioned above, there is a desire to electromagnetically shield various structures (e.g., rooms, entire buildings, etc.). Often, conductive materials (e.g., in the form of sheets or metal coatings) may be applied to the surfaces (e.g., walls, floors, ceilings, etc.) of a structure or be disposed within the surfaces of a structure to provide electromagnetic shielding to the structure. The utilization of conductive materials in this manner can cause the structure to operate similar to a Faraday cage. Conceptually, such an approach can be effective for electromagnetic shielding. However, from a practical perspective, a perfect Faraday cage cannot be constructed because, for example, discontinuities in the form of, for example, seams in the conductive material are present, and no practical approach for eliminating such seams has been developed. These discontinuities in the conductive material can create leakage points in the shielding, which may be unacceptable in many applications.

As discussed above, a drawback of conventional Faraday cage shielding approaches is that disposing the conductive materials in association with the surfaces of a structure makes the surfaces energy-reflective. As such, propagating energy, for example in the form of EM waves, within a shielded room may be reflected back into the room without attenuation. After encountering a shielded surface, the reflected energy will still be available for further interactions with the surfaces of the room, thereby increasing the probability that the reflected energy will interact with a seam or other leakage point.

The leakage points associated with discontinuities therefore form a technical problem in Faraday cage shielding approaches, because shielding effectiveness is inversely correlated to leakage. Further, it has been shown based on studies using steel plates or pristine foil that shielding effectiveness increasingly degrades as the frequency of the EM waves increases. In other words, Faraday cage shielding approaches are increasingly less effective as the frequency of incident free-space energy waves increase. Therefore, in the context of a Faraday cage shielding implementation, supplemental technical solutions that address the propagation of high frequency energy (e.g., greater than 100 MHz) would be highly beneficial for improving shielding effectiveness.

Figure 13:
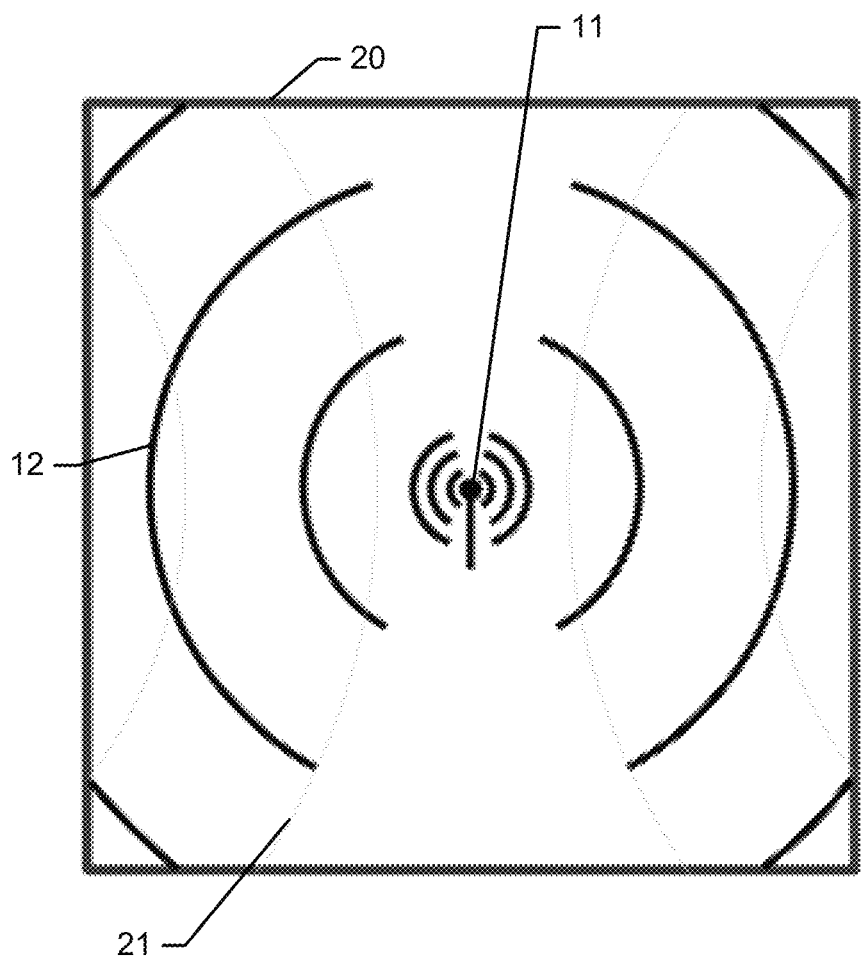
FIG. 13 illustrates an example room with walls having free-space absorber metamaterial according to some example embodiments.

In this regard, FIG. 13 shows an example room with walls 20 that has been outfitted with free-space energy absorbing materials. Similar to FIGS. 1-3, the example room has an energy source 11 disposed therein that outputs EM waves 12. However, upon interacting with the free-space energy absorbing walls 20, the EM waves 12 are substantially absorbed and converted into heat. However, since the free-space energy absorbing walls 20 may not be perfect absorbers at the frequency of EM wave 12, some portion of the energy of the EM wave 12 may be reflected as indicated by reflected wave 21.

As such, according to some example embodiments, a free-space absorber metamaterial is provided that can be fabricated to absorb incident free-space energy, and in particular high-frequency incident free-space energy. By absorbing this energy, the likelihood of reflections is reduced due to the presence of Faraday cage shielding and therefore the chances of an interaction with a leakage points (e.g., seam-based leakage points) is also reduced. Such free-space absorber metamaterials, according to some example embodiments, can be resonant by nature, and measures may be taken to expand the frequency band(s) that are affected by the free-space absorber metamaterials, particularly at high frequencies.

Accordingly, a free-space absorber metamaterial is provided, according to some example embodiments, that works in synergy with Faraday cage shielding approaches to increase the overall shielding effectiveness of a space. According to some example embodiments, a free-space absorber metamaterial may operate cooperatively with and be integrated with Faraday cage shielding (e.g., conductive material sheets or the like) to form a singular metamaterial structure that provides both shielding and free-space absorption attributes. In example embodiments where the free-space absorber metamaterial is integrated with the Faraday cage shield, benefits with respect to weight and cost can be realized.

Figure 14:
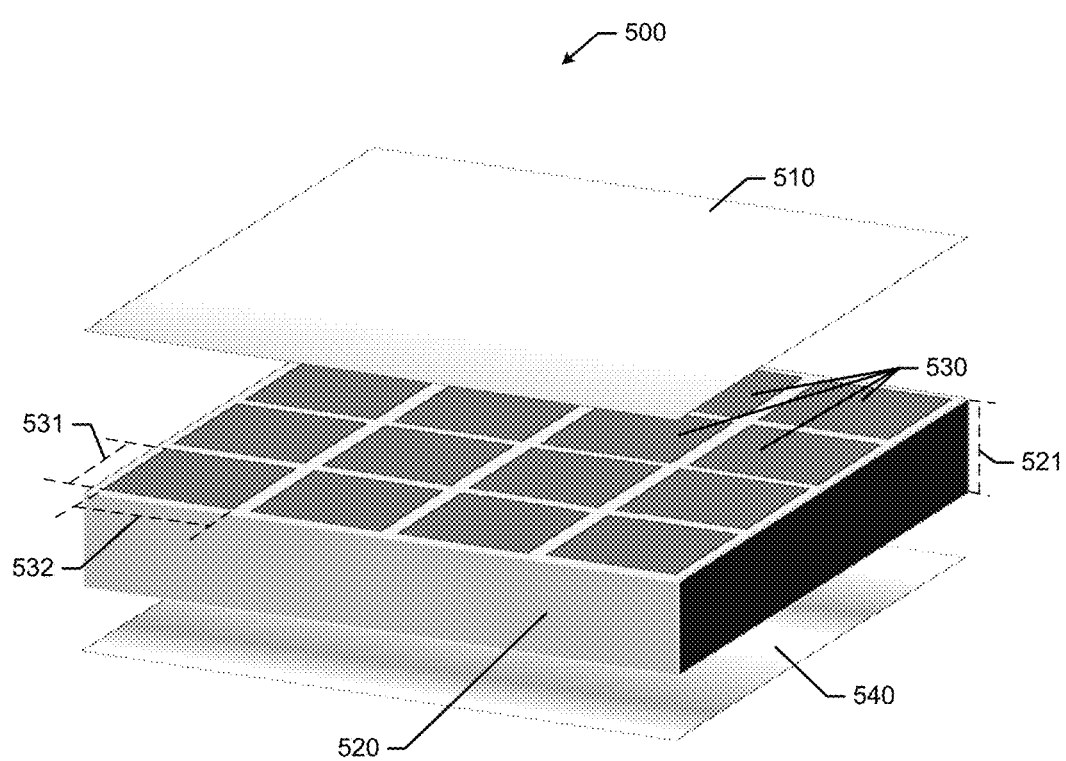
FIG. 14 illustrates an exploded, perspective side view of a free-space absorber metamaterial according to some example embodiments.
Figure 15:
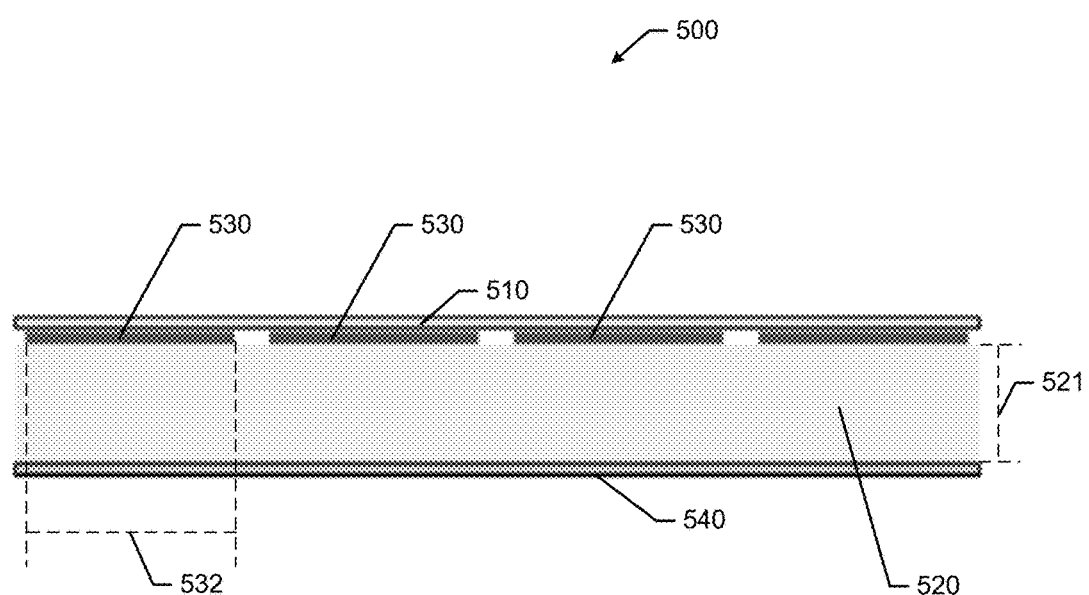
FIG. 15 illustrates an cross-section side view of a free-space absorber metamaterial according to some example embodiments.

With reference to FIGS. 14 and 15, an example free-space absorber metamaterial 500 is shown. FIG. 14 provides a perspective, exploded side view of the free-space absorber metamaterial 500, while FIG. 15 provides a cross-section side view of the free-space absorber metamaterial 500. The free-space absorber metamaterial 500 may be comprised of a protective layer 510, a dielectric spacer 520, patches 530, and a conductive backplane 540. These components, according to some example embodiments, may be stacked into a structure such that from a structural surface (e.g., wall, floor, ceiling, etc.) towards the interior of the space (e.g., room), the layers are disposed with the conductive backplane 540 first, the dielectric spacer 520 second, the patches 530 third, and the protective layer 510 fourth.

The conductive backplane 540 may be formed of any conductive material, such as copper, steel, aluminum, certain composite metals, or the like. The conductive backplane 540 may be included as part of the free-space absorber metamaterial 500 during fabrication or, according to some example embodiments, the conductive backplane 540 may be installed in or on a structural surface separately, as part of a Faraday cage shielding installation. In instances where the conductive backplane 540 is installed separately, the remaining components of the free-space absorber metamaterial 500 may be subsequently installed on top of the conductive backplane 540, either as a unit or individually. According to some example embodiments, the conductive backplane 540 may be disposed on a plane of the free-space absorber metamaterial 500 that is or will be after installation shared with a structural surface (wall, floor, ceiling, etc.).

The dielectric spacer 520 may be configured to provide a dielectric space or gap between the conductive backplane 540 and the patches 530 and may be affixed to the conductive backplane 540. The patches 530 may be affixed to a first side of the dielectric spacer 520, and, according to some example embodiments, a second side of the dielectric spacer may be affixed to the conductive backplane 540, for example, during fabrication or installation on a structural surface. As further described below, the dielectric spacer 520 may have a thickness that defines a gap distance 521 that is selected based on the desired performance characteristics for the free-space absorber metamaterial 500. In this regard, the dielectric spacer 520 may be selected (e.g., by selecting a certain material) to have complex dielectric properties that optimize performance of the free-space absorber metamaterial 500, such as, for example relative permittivity or electric susceptibility. Further, according to some example embodiments, a material for the dielectric space 520 may be selected that has a high polarizability. The dielectric spacer may also operate as a standoff between the patches 530 and the conductive backplane 540 to separate the patches 530 and the conductive backplane 520 a desired distance apart (i.e., the gap distance 521).

The dielectric spacer 520 may be formed of various materials that can provide desired dielectric attributes. According to some example embodiments, air may be an effective selection for a dielectric material. However, to provide support to maintain the spacing or gap distance 521, the dielectric spacer 520 may be formed of, for example, of a foam. The foam may encapsulate air in small pockets or bubbles. In this regard, foam, according to some example embodiments, can have dielectric properties similar to air, and also benefits from providing a degree of mechanical strength while also being lightweight and inexpensive. Additionally, foam can offer benefits with regard to thermal and sound insulating properties for the room being shielded. Since foam has similar dielectric properties to air, a dielectric spacer 520 comprised of foam can be modeled based on dielectric characteristics for air.

Alternatively, according to some example embodiments, the dielectric spacer 520 may be comprised of a rigid grid or lattice-type structure that can operate to maintain the gap distance 521. In this regard, the grid or lattice-type structure may be comprise a number of posts and connecting walls forming an array of shapes such as squares, rectangles, circles, ovals, triangles, or the like, with air disposed within the shapes. The posts or walls may have a height that is selected for the desired gap distance 521. The grid or lattice-type structure may be formed of a strong plastic or other rigid material that is strong and capable of withstanding impacts, relative to a foam dielectric spacer 520. As such, a dielectric spacer 520 of this type may be suitable for a floor installation that is required to support significant weight.

The free-space absorber metamaterial 500 may also include patches 530, possibly disposed as an array of patches 530. The patches 530 may be affixed to a top-side of the dielectric spacer 520 (as shown in FIG. 14) or the patches 530 may be affixed to the bottom-side of the protective layer 510. In this regard, the patches 530 may be disposed on and define a plane of the free-space absorber metamaterial 500, where the dielectric spacer 520 is disposed between the plane associated with the positioning of the conductive backplane 540 and the plane associated with the positioning of the patches 530, where these planes are parallel planes. Patches 530 may be formed from any material with a known or controllable-at-fabrication resistivity (e.g., controlled sheet resistivity). The resistance of a given patch may be based on both the resistance of material used to form the patch and the area of the patch. In this regard, according to some example embodiments, a controlled sheet resistivity for the patches 530 may be required to be within a reasonable tolerance, such as, for example, ±5% of the desired resistance value for a unit area. According to some example embodiments, the patches 530 may be formed by, for example, printing carbon ink onto either the dielectric spacer 520, the protective layer 510, or another substrate. According to some example embodiments, the patches 530 may alternatively be formed of a filled plastic, such as a metallic-filled plastic. In this regard, a polyethylene terephthalate (PET) material may be used to form the patches 530.

According to some example embodiments, the patches 530 may have a defined shape, such as, for example a square, rectangle, circle, oval, triangle, or the like. Each patch 530 may have the same shape and area, but, according to some example embodiments, different shapes and areas amongst the patches 530 may also be implemented. The patches 530 may be spaced apart and physically isolated from each other. The patches 530 may also have a defined pitch or number of patches per unit area within the array. In this regard, an array of patches that having a higher or greater pitch means that there are more patches per unit area and the patches are smaller given a standard spacing between the patches. Accordingly, an array of patches having a lower or smaller pitch means that there are less patches per unit area and the patches are larger given a standard spacing between the patches. Each patch 530 may be spaced apart from the other patches 530 by a patch gap distance, which may, according to some example embodiments, be uniform for the array. Further, each patch 530 may be defined as having a patch area. In example embodiments where the patches 530 are squares or rectangles, the area of a patch 530 may be defined by a patch length 532 and a patch width 531. In an example embodiment when the patches 530 are squares the patch length 532 and the patch width 531 may be the same distance.

The protective layer 510 may provide an external surface of the free-space absorber metamaterial 500 that is closest to the interior of the room to be shielded. The protective layer 510 may be applied and affixed to the dielectric spacer 520 and the patches 530. The protective layer 510 may perform a protective function for the free-space absorber metamaterial 500 to guard against damage caused by, for example, abrasion, ultraviolet light, humidity, or the like. Further, the protective layer 510 may also provide a means for controlling the appearance of the free-space absorber metamaterial 500 in a finished installation. According to some example embodiments, the protective layer 510 may be formed of, for example, a polymer sheet that may be several mils thick.

The electrical properties of the component materials and dimensions of the component materials may operate together to determine a center or operating frequency and bandwidth for absorption by the free-space absorber metamaterial 500. For example, an operating frequency and bandwidth of absorption for the free-space absorber metamaterial 500 be based on an area of the patches 530 and an associated resistance of the patches 530, the gap distance 521, as well as, the complex dielectric properties of the dielectric spacer 520. Further, the amount of energy absorbed may also a function of the electrical properties and dimensions of the component materials. Modeling and simulations may be used to predict the center (or operating) frequency, bandwidth, and amount of absorption for a free-space absorber metamaterial 500. The properties of the materials that determine the center frequency, bandwidth, and amount of absorption may include the resistance of the material used to form the patches 530, the material type and resistance of the conductive backplane 540, and the electric susceptibility or the electric permittivity of the dielectric spacer 520. The dimensional attributes that can factor into determining the center frequency, bandwidth, and amount of absorption may include the gap distance 521 or width of the dielectric spacer 520, and the shape and area of the patches 530 (e.g., the patch length 532 and patch width 531). Accordingly, these parameters of the free-space absorber metamaterial 500 may be modeled and simulated to achieve the desired center frequency, bandwidth, and amount of absorption for a free-space absorber metamaterial 500.

While it is understood that an array of patches 530 may be included to form a free-space absorber metamaterial, an individual unit cell for the free-space absorber metamaterial 500 may also be defined. In this regard, the unit cell may comprise a single patch 530, the dielectric spacer 520, and the backplane 540. With this unit cell as a building block, various configurations of free-space absorber metamaterials may be constructed. According to some example embodiments, this unit cell may be smaller than one wavelength of the operating frequency.

According to some example embodiments, the bandwidth that is achievable with a single planar array of patches 530 with a single dielectric spacer 520 may be limited, and applications may exist that require a larger range of frequencies to be absorbed by a free-space absorber metamaterial. According to some example embodiments, to achieve absorption of a broader or larger bandwidth, additional layers of dielectric spacers and patches may be stacked into a free-space absorber metamaterial to form a multi-layer free-space absorber metamaterial.

Figure 16A:
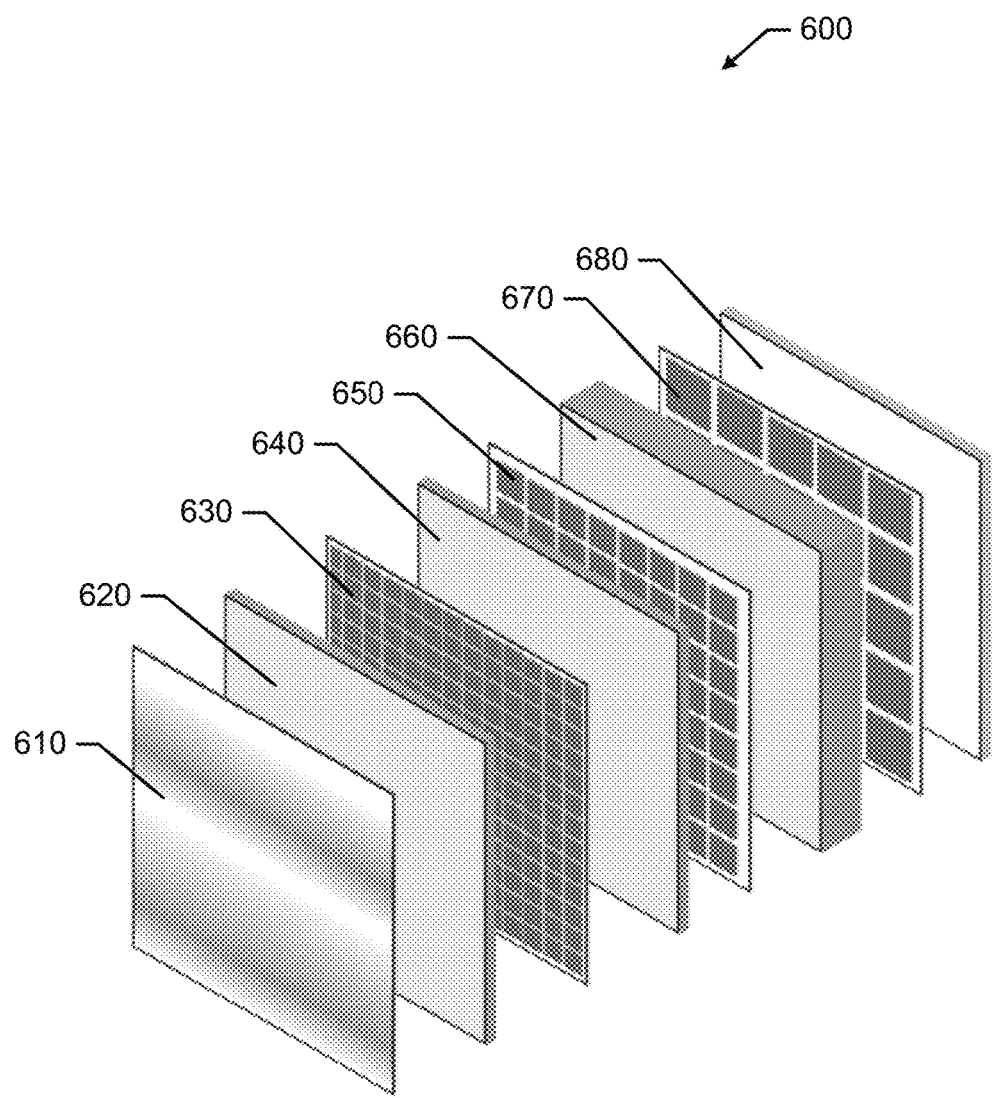
FIG. 16A illustrates an exploded, perspective side view of a multi-layer free-space absorber metamaterial according to some example embodiments.
Figure 16B:
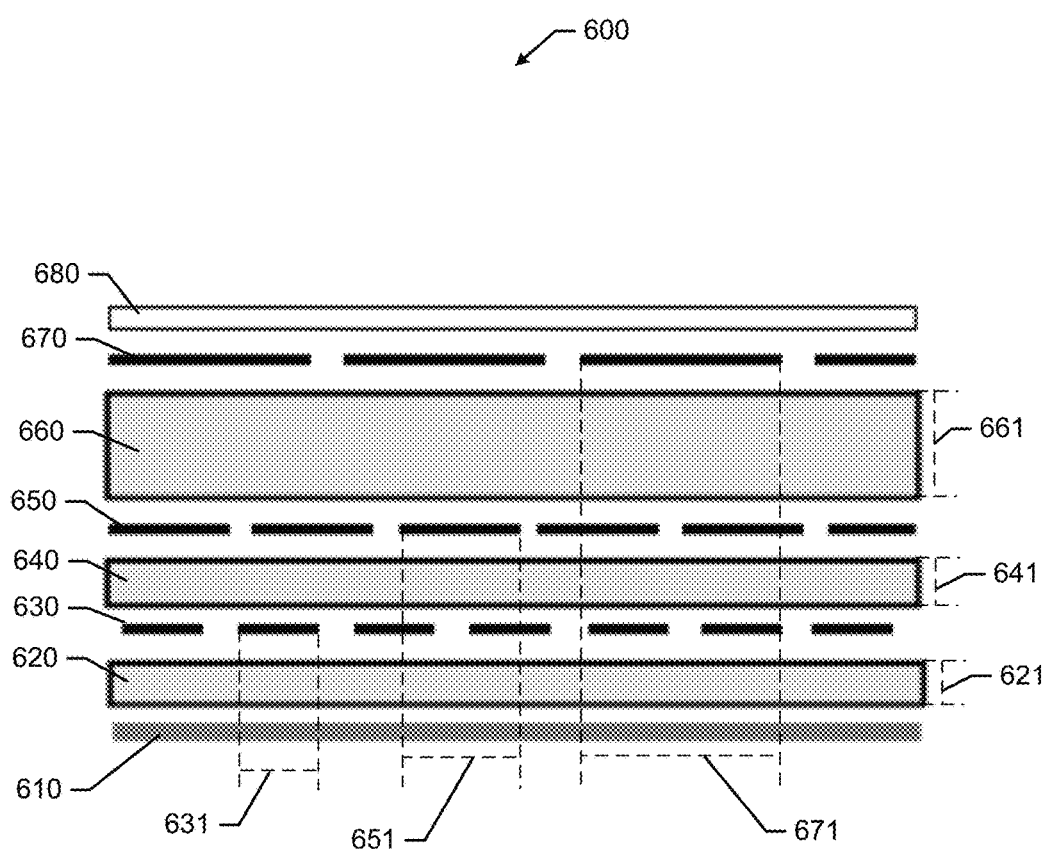
FIG. 16B illustrates an cross-section side view of a multi-layer free-space absorber metamaterial according to some example embodiments.

Such an implementation is shown in FIGS. 16A and 16B. In this regard, the multi-layer free-space absorber metamaterial 600 comprises three dielectric spacers and three layers of patches. It is noted that while the example embodiments shown in FIGS. 16A to 19B consider a multi-layer free-space absorber metamaterial with three layers of patches and three dielectric spacers, one of skill in the art would appreciate that any number of layers of patches and dielectric spacers may be used to form a multi-layer free-space absorber metamaterial with desired frequency absorption characteristics such as bandwidth.

Considered in order from the structural surface (e.g., wall, floor, ceiling, etc.) to the interior of the shielded space, the multi-layer free-space absorber metamaterial 600 may comprise a conductive backplane 610, a first dielectric spacer 620, a first array of patches 630, a second dielectric spacer 640, a second array of patches 650, a third dielectric spacer 660, a third array of patches 670, and a protective layer 680. As described above, the conductive backplane 610 may be associated with an installation of Faraday cage shielding of a space. The conductive backplane 610, the first array of patches 630, the second array of patches 650, and the third array of patches 670 may be disposed on respective parallel planes and spaced apart by the dielectric spacers 620, 640, 660. Thus, the first array of patches 630 may be disposed on a first plane, the second array of patches 650 may be disposed on a second plane, and the third array of patches 670 may be disposed on a third plane, where each of these planes are oriented in parallel.

According to some example embodiments, the patches of the first array of patches 630, the second array of patches 650, and the third array of patches 670 may be square shaped and therefore the patch length may be the same as the patch width for each patch in a respective array. As such, with respect to the multi-layer free-space absorber metamaterial 600, a patch length may therefore be used to define the area of a patch. Accordingly, patches in the first array of patches 630 have a patch length 631. Patches in the second array of patches 650 have a patch length 651. Finally, patches in the third array of patches 670 have a patch length 671. In this regard, with respect to the example multi-layer free-space absorber metamaterial 600, the area of the individual patches in the first array of patches 630 is less than the area of the individual patches in the second array of patches 650, and thus the pitch of the first array of patches 630 is greater than the pitch of the second array of patches 650. Further, the area of the individual patches in the second array of patches 650 is less than the area of the individual patches in the third array of patches 670, and thus the pitch of the second array of patches 650 is greater than the pitch of the third array of patches 670. Additionally, with respect to the example multi-layer free-space absorber metamaterial 600, the resistance of a patch in the first array of patches 630 is greater than the resistance of a patch in the second array of patches 650, and the resistance of a patch in the second array of patches 650 is greater than the resistance of a patch in the third array of patches 670.

Similarly, each of the dielectric spacers may have a different thickness. In this regard, the first dielectric spacer 620 has a first thickness 621. The second dielectric spacer 640 has a thickness 641. Finally, the third dielectric spacer 660 has a thickness 661. Accordingly, with respect to the example multi-layer free-space absorber metamaterial 600, the thickness 621 is less than thickness 641, and thickness 641 is less than the thickness 661.

Due to the inclusion of the various arrays of patches and dielectric spacers, the multi-layer free-space absorber metamaterial 600 may operate to absorb energy at different operating frequencies. In this regard, each combination of dielectric spacers with arrays of patches forms a sub-free-space absorber metamaterial with a specific operating or center frequency. The multi-layer free-space absorber metamaterial 600 may have operating frequency bands centered at, for example, 400 MHz, 1 GHz, and 10 GHz. Depending on the frequency of the free-space energy, different arrays of patches and dielectric spacers may be active to cause the energy to be absorbed as further explained below with respect to FIGS. 17A to 19B.

Figure 17A:
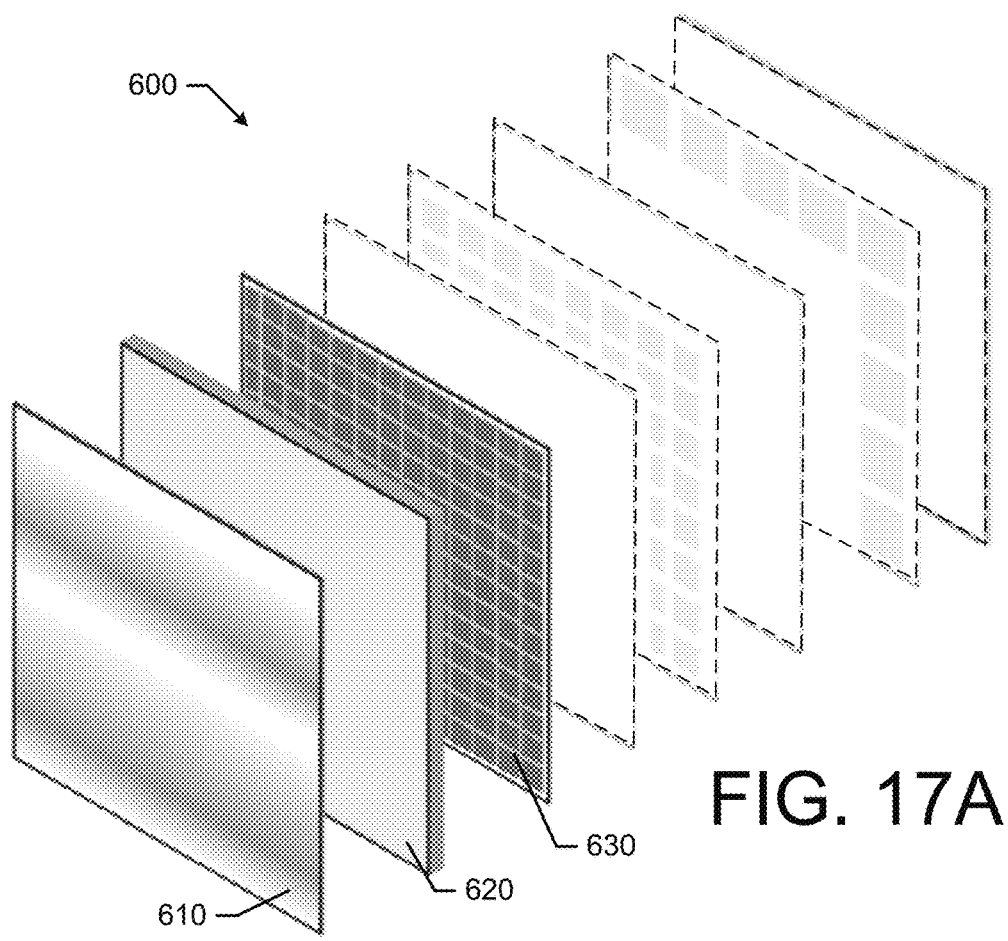
FIG. 17A illustrates an exploded, perspective side view of a multi-layer free-space absorber metamaterial with high frequency activated components according to some example embodiments.
Figure 17B:
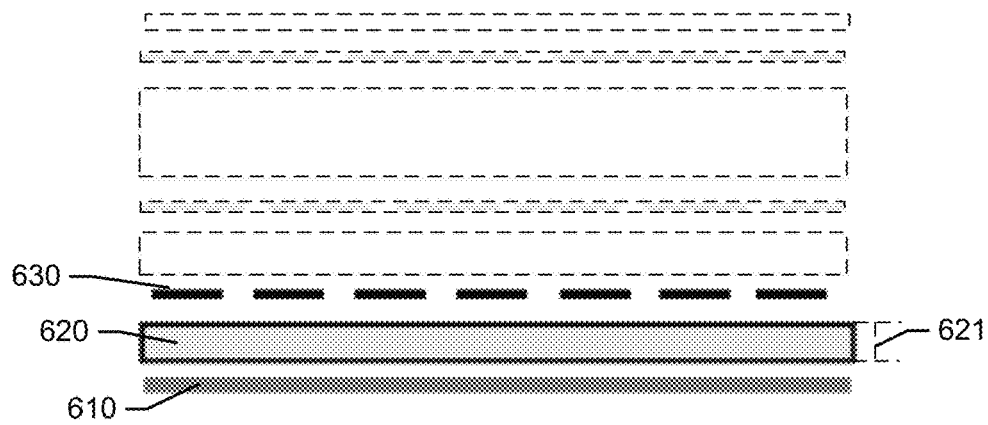
FIG. 17B illustrates an cross-section side view of a multi-layer free-space absorber metamaterial with high frequency activated components according to some example embodiments.

With reference to FIGS. 17A and 17B, higher frequency (shorter wavelength) energy (e.g., 10 GHz) may pass through the outer layers (furthest from the structure surface and closer to the interior of the shielded space) having the larger area patches, but ultimately interact with a sub-free-space absorber metamaterial formed by the conductive backplane 640, the first dielectric spacer 620, and the first array of patches 630. As such, the effective gap distance for this sub-free-space absorber metamaterial is the same as thickness 621. The other layers of the multi-layer free-space absorber metamaterial 600 have little or no effect on the higher frequency energy as indicated by the outlines of these layers being dashed. In particular, the second array of patches 650 and the third array of patches 670 do not form resonant structures at these higher frequencies and therefore the second array of patches 650 and the third array of patches 670 absorb little or no energy at these frequencies.

Figure 18A:
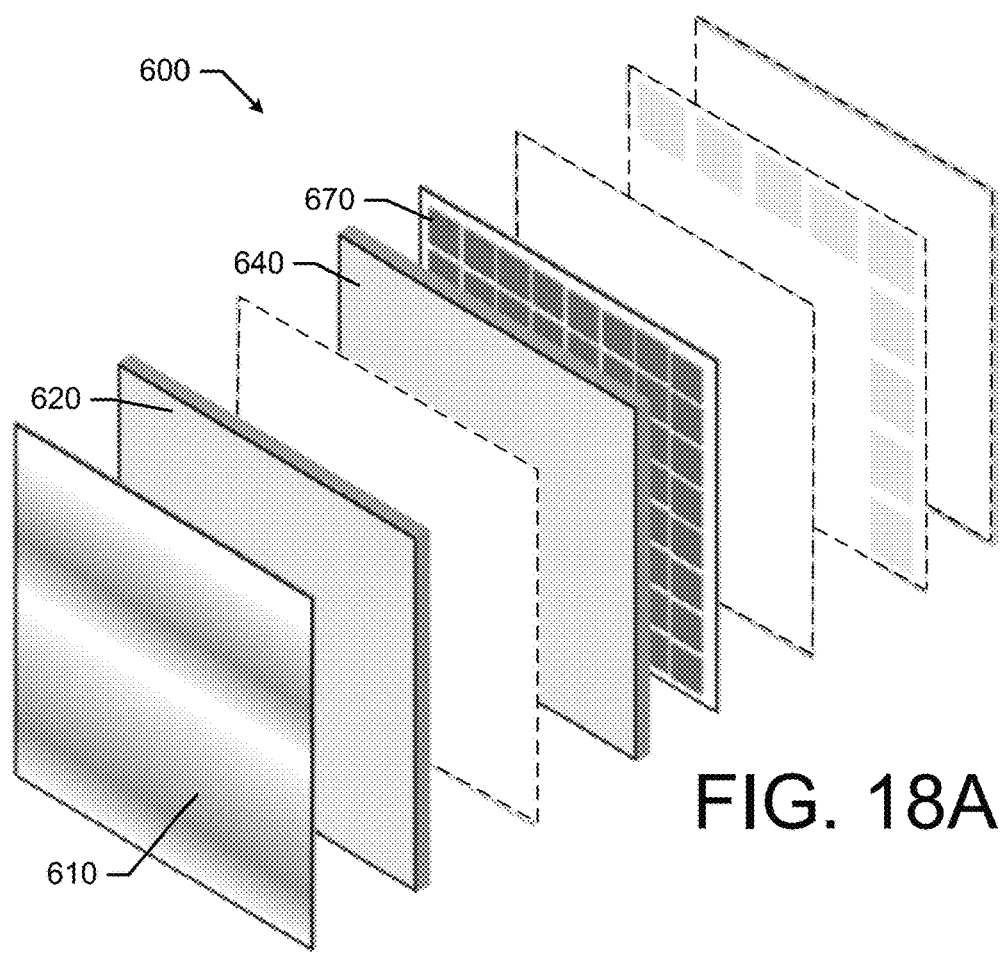
FIG. 18A illustrates an exploded, perspective side view of a multi-layer free-space absorber metamaterial with intermediate frequency activated components according to some example embodiments.
Figure 18B:
FIG. 18B illustrates an cross-section side view of a multi-layer free-space absorber metamaterial with intermediate frequency activated components according to some example embodiments.

With reference to FIGS. 18A and 18B, intermediate frequency (intermediate wavelength) energy (e.g., 1 GHz) may interact with a sub-free-space absorber metamaterial formed by the conductive backplane 640, the first dielectric spacer 620, the second dielectric spacer 640, and the second array of patches 650. As such, the effective gap distance 642 for this sub-free-space absorber metamaterial is the thickness 621 plus (or combined with) the thickness 641. The other layers of the multi-layer free-space absorber metamaterial 600 have little or no effect on the intermediate frequency energy as indicated by the outlines of these layers being dashed. In particular, the first array of patches 630 and the third array of patches 670 do not form resonant structures at these intermediate frequencies and therefore the first array of patches 630 and the third array of patches 670 absorb little or no energy at these intermediate frequencies.

Figure 19A:
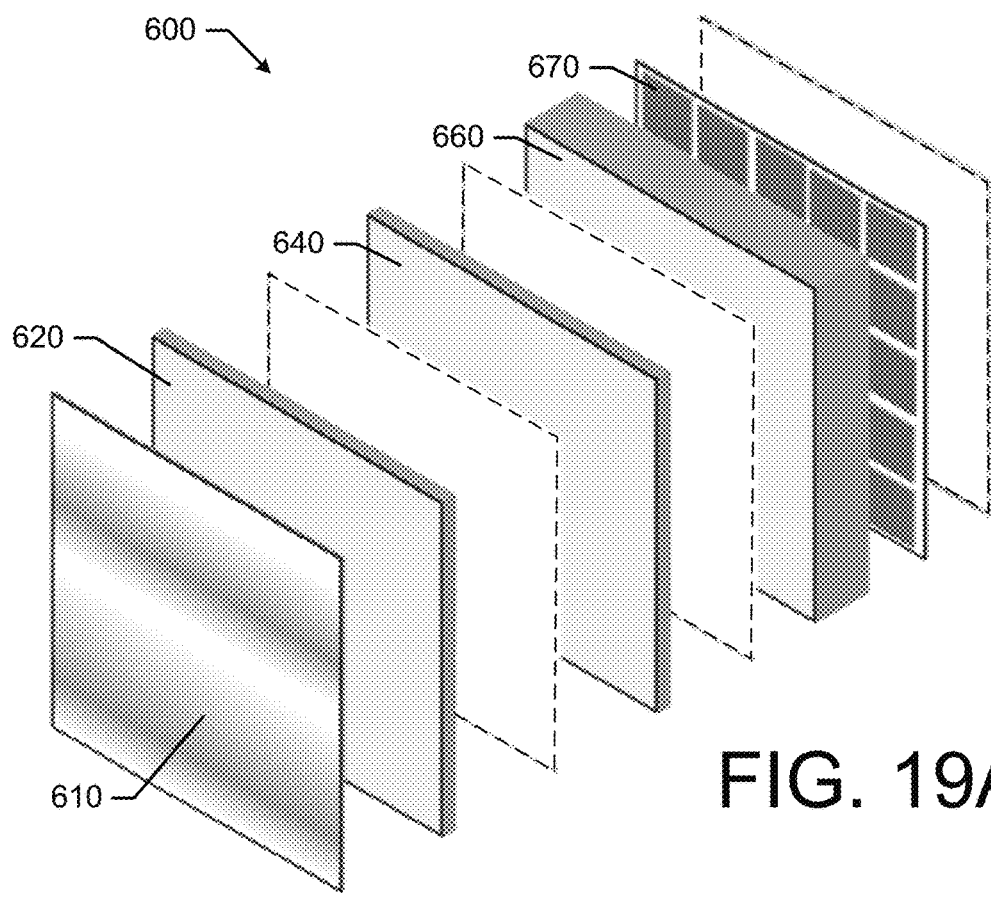
FIG. 19A illustrates an exploded, perspective side view of a multi-layer free-space absorber metamaterial with low frequency activated components according to some example embodiments.
Figure 19B:
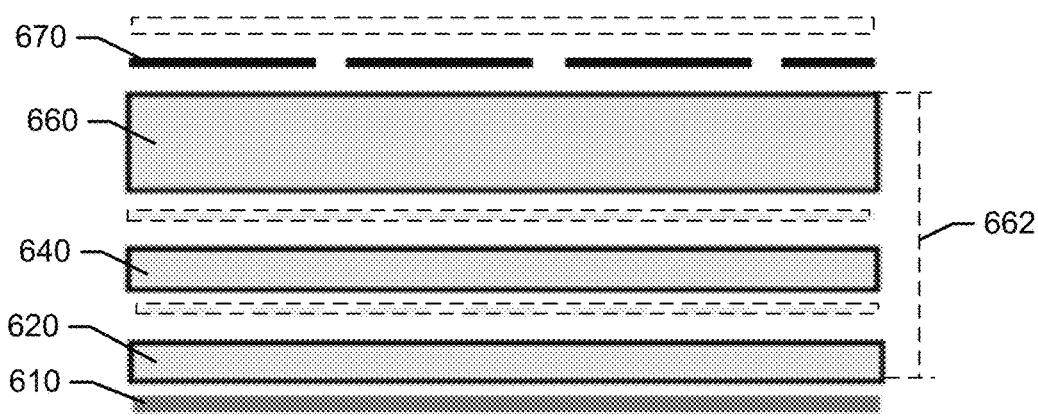
FIG. 19B illustrates an cross-section side view of a multi-layer free-space absorber metamaterial with low frequency activated components according to some example embodiments.

With reference to FIGS. 19A and 19B, lower frequency (long wavelength) energy (e.g., 400 MHz) may interact with a sub-free-space absorber metamaterial formed by the conductive backplane 640, the first dielectric spacer 620, the second dielectric spacer 640, the third dielectric spacer 660, and the third array of patches 670. As such, the effective gap distance 662 for this sub-free-space absorber metamaterial is the thickness 621 combined with the thickness 641 combined with the thickness 661. The other layers of the multi-layer free-space absorber metamaterial 500 have little or no effect on the lower frequency energy as indicated by the outlines of these layers being dashed. In particular, the first array of patches 630 and the second array of patches 650 do not form resonant structures at these lower frequencies and therefore the first array of patches 630 and the second array of patches 650 absorb little or no energy at these intermediate frequencies.

Accordingly, by increasing in the area of the patches and the gap distance, a lower operating frequency for the sub-free-space absorber metamaterial can be realized. Similarly, as the area of the patches and the gap distance decreases, a higher operating frequency for the sub-free-space absorber metamaterial can be realized. By using this principle, various frequencies and bandwidths can be realized by selecting the number and placement (e.g., gap distance) of patch arrays of differing patch areas within the free-space absorber metamaterial.

Figure 20A:
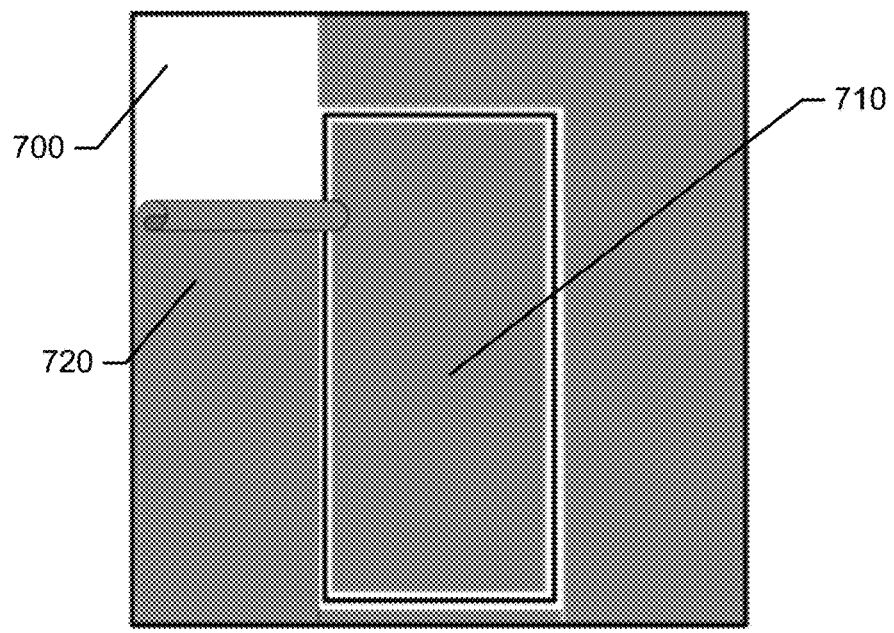
FIG. 20A illustrates a shielded wall with a door according to some example embodiments.
Figure 20B:
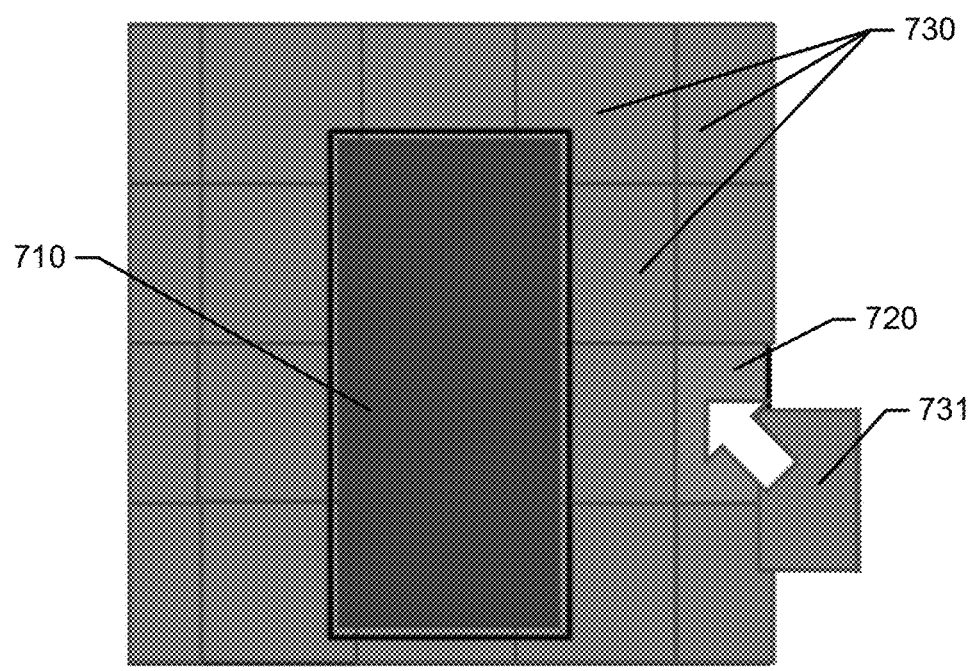
FIG. 20B illustrates a shielded wall having free-space absorber metamaterial applied thereto and a door according to some example embodiments.

The example free-space absorber metamaterials described herein may be formed into tiles, such as, for example, 1 foot by 1 foot tiles. In this regard, if the free-space absorber metamaterial tiles are to be used in an application where Faraday cage shielding is already in place, then the tiles need not include a conductive backplane. With respect to FIG. 20A, a wall 700 is shown with a Faraday cage conductive backplane 720 being installed in the form of sheets. The wall 700 includes a doorway 710. According to some example embodiments, as shown in FIG. 20B, free-space absorber metamaterial tiles 730, including a last to be installed tile 731, may be applied onto the Faraday cage conductive backplane 720 and around the doorway 710. In this regard, the tiles 730 may be held in close interaction with the Faraday cage conductive backplane 720 due to the application of adhesives to the structural surface side of the tiles 730, 731. Because the tiles 730 are relatively lightweight due to their fabrication and the materials that are used to construct the tiles 730, many common adhesives can be used. Accordingly, less permanent adhesives may also be used which allow for removing the tiles 730 (e.g., from the conductive backplane 720) at a later date, possibly to alter or replace the tiles 730 with other tiles having different operating frequencies or attributes.

Figure 21A:
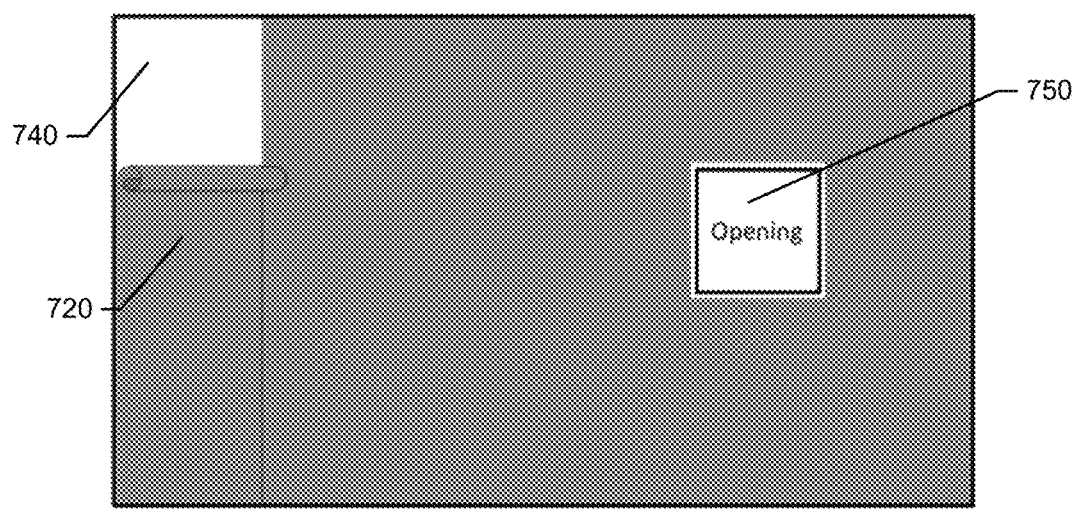
FIG. 21A illustrates a shielded wall with an opening according to some example embodiments.
Figure 21B:
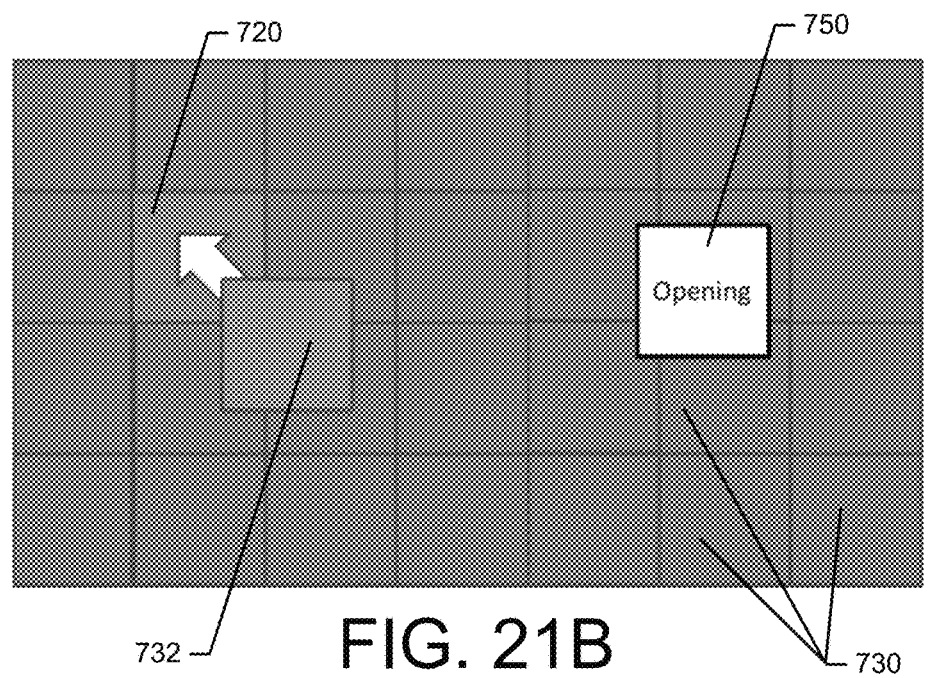
FIG. 21B illustrates a shielded wall having free-space absorber metamaterial applied thereto and an opening according to some example embodiments.

FIGS. 21A and 21B show a similar tile installation, however, with an opening 750 (e.g., window opening) in a wall 740. As shown in FIG. 21A, a Faraday cage conductive backplane 720 may be applied to the wall 740 around the opening 750. Subsequently, as shown in FIG. 21B, free-space absorber metamaterial tiles 730 can again be attached on top of the Faraday cage conductive backplane 720, including tile 732. The tiles 730 may be disposed across the wall 740 and around the opening 750 to improve the shielding beyond what is offered by the Faraday cage shielding alone.

Having described some example embodiments that are designed to address surface waves and some example embodiments that are designed to address free-space energy, additional example embodiments will now be described that operate to address both surface waves and free-space energy in the context of a shielding solution for spaces. In this regard, building upon the structure 100 described in FIG. 5, a surface wave attenuator and free-space absorber (SWAFSA) metamaterial may be provided. Such a solution with these varied functionalities can operate to dramatically improve a shielding system's ability to meet shielding standards such as ASTM E1925-10.

Figure 22:
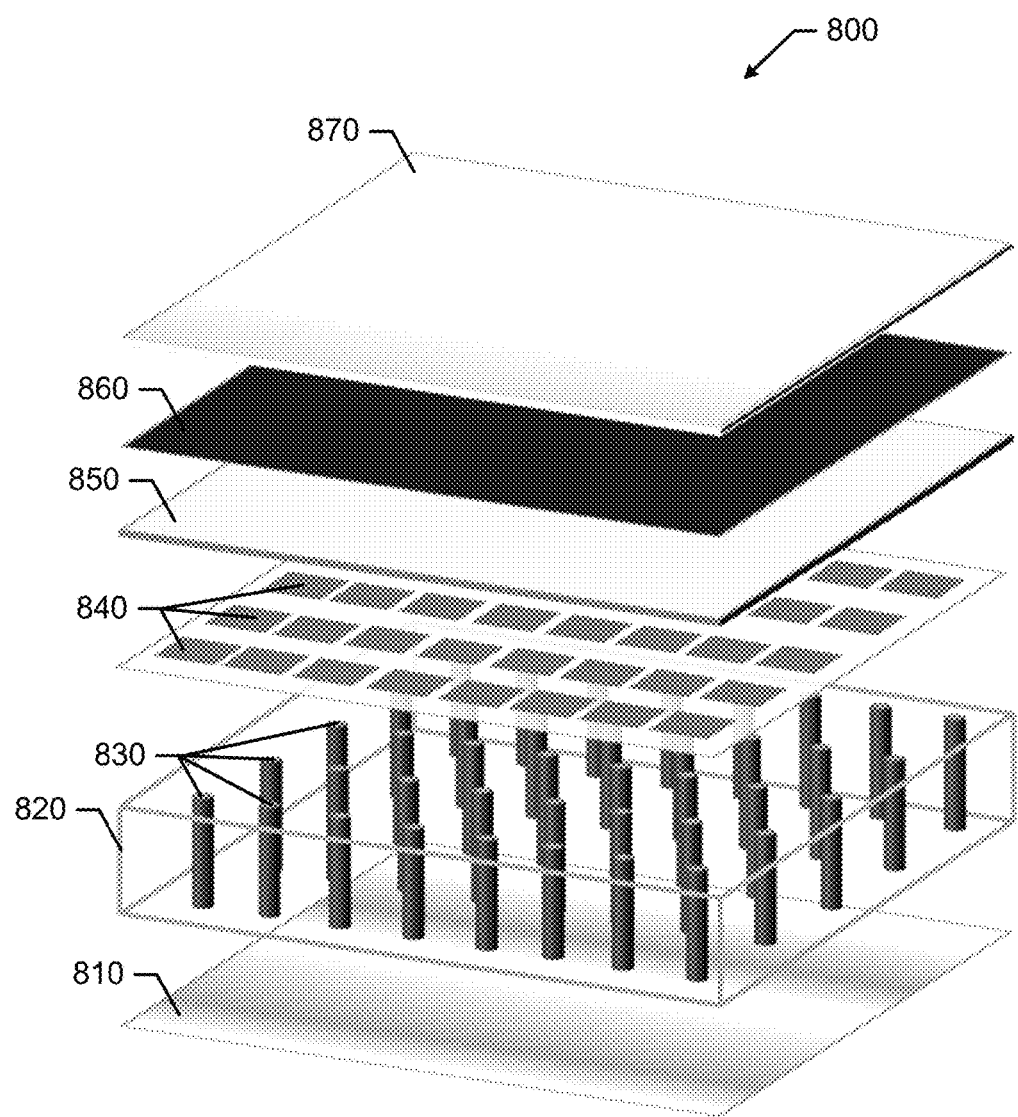
FIG. 22 illustrates an exploded, perspective side view of a surface wave attenuator and free-space absorber (SWAFSA) metamaterial according to some example embodiments.
Figure 23:
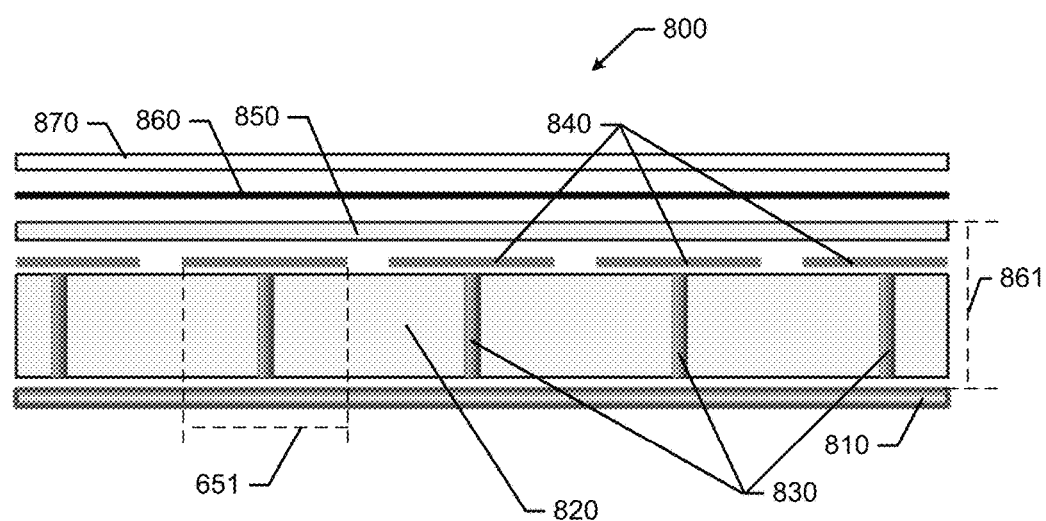
FIG. 23 illustrates a cross-section side view of a SWAFSA metamaterial according to some example embodiments.

In this regard, according to some example embodiments, FIG. 22 shows a perspective, exploded side view of an example SWAFSA metamaterial 800 and FIG. 23 shows a cross-section side view of the SWAFSA metamaterial 800. The SWAFSA metamaterial 800 may comprise, in order form the structural surface to the interior of the space, a conductive backplane 810, a lower dielectric 820, vias 830, patches 840, an upper dielectric 850, a resistive layer 860, and a protective layer 870. According to some example embodiments, the SWAFSA metamaterial 800 may be comprised of the structure 100 described above with the addition of the upper dielectric 850 and the resistive layer 860 as further described below.

The conductive backplane 810 may be the same or similar to conductive backplane 120, 540, or 610. According to some example embodiments, the conductive backplane 810 may be a component of a Faraday cage shielding installation and the remainder of the SWAFSA metamaterial 800 may be applied to the conductive backplane 810 during installation to a structural surface of, for example, a building having the conductive backplane 810 already installed.

The lower dielectric 820 may be configured to provide dielectric spacing between the patches 840 and the conductive backplane 810. The lower dielectric 820 may be disposed between the conductive backplane 810 and the patches 840. The lower dielectric 820 may comprise air as the dielectric medium. However, according to some example embodiments, the lower dielectric 820 may also provide mechanical support to the SWAFSA metamaterial 800 and may therefore include a foam or a rigid grid or lattice-like structure that provides sufficient mechanical support. In this regard, the lower dielectric 820 may include, for example, the frame or a version of the frame described with respect to FIG. 6A above.

The SWAFSA metamaterial 800 may also include vias 830. The vias 830 may be conductive elements that pass through openings and are therefore disposed within the lower dielectric 820. The vias 839 may provide an electrical connection between each of the patches 840 and the conductive backplane 810. In this regard, each via 830 may be electrically and physically coupled to a patch 840. The vias 830 may be the same or similar to the vias 130 described above (e.g., the vias 830 may be via springs) and may be similarly supported.

The SWAFSA metamaterial 800 may also include an array of patches 840 that are disposed on a plane parallel to the conductive backplane 810. The patches 840 may be formed in a manner the same or similar to the patch 110 or the patches 530. In this regard, the patches 840 may be formed in the same or similar shapes and areas, and may have dimensional parameters for, for example, the patch length 651. According to some example embodiments, the patches 840 may be disposed on a substrate, and possibly on a bottom side of a substrate such that an electrical connection can be formed between the patches 840 and the vias 830. The patches 840 may be disposed or be adjacent to what may be considered a top side of lower dielectric 820 and the vias 830 for reference purposes.

As mentioned above, while the lower dielectric 820, the vias 830, and the patches 840 may operate together to perform surface wave attenuation functions of the SWAFSA metamaterial 800 similar to the structure 100 and arrays 101, 200 described above, the upper dielectric 850 and the resistive layer 860 may operate, based on the spacing formed with the lower dielectric 820, as a free-space energy absorber.

In this regard, the SWAFSA metamaterial 800 may include the upper dielectric 850 which may be a dielectric spacer that operates to insulate the resistive layer 860 from the patches 840 and can be selected to a have desired thickness to optimize the absorbing features of the SWAFSA metamaterial 800. As such, the upper dielectric material 850 may be formed in the same or similar manner as the dielectric spacer 520. The upper dielectric 850 may be disposed on or adjacent to the patches 840. Further, the upper dielectric 850 may be disposed between the patches 840 and the resistive layer 860.

The resistive layer 860 may be disposed on a plane parallel to the patches 840 and the conductive backplane 810, and spaced apart from the conductive backplane 810 by the lower dielectric 820 and the upper dielectric 850. According to some example embodiments, the resistive layer 860 may be a uniform sheet of resistive material that is not patterned with, for example, an array of patches. The spacing provided by the lower dielectric 820 and the upper dielectric 850 may be the gap distance 861 for the resistive layer 860. This gap distance 861 together with the resistance values for the resistive sheet 860 may be factors upon which the operating frequency and bandwidth of absorption for the SWAFSA metamaterial 800 are determined. In operation, the resistive layer 860 may provide a resistance to the SWAFSA metamaterial 800 to form an RLC resonant circuit with the capacitance formed between the patches 840 and the conductive backplane 810 and the inductance provided by the vias 830 and the patches 840.

The resistive layer 860 may be formed in number of ways. For example, the resistive layer 860 may be formed as a very thin sheet of metal (e.g., copper, aluminum, or the like) onto a supporting substrate. In some example embodiments, the resistive layer 860 may be formed by printing a thin layer of carbon ink on a supporting substrate. Regardless, of the manner of forming the resistive layer 860, the resistance per unit area may be known and used as a parameter for designing the SWAFSA metamaterial 800 to absorb energy at a particular frequency with a particular bandwidth. Following from the description above, in accordance with some example embodiments, additional layers of dielectric and resistive layers may be incorporated into the SWAFSA metamaterial 800 design to increase the bandwidth of operation for absorption, similar to the multi-layer free-space absorber metamaterial 600.

The SWAFSA metamaterial 800 may also include a protective layer 870. The protective layer 870 may be exposed to the interior of the space to be shielded. The protective layer 870 may be formed and operate in the same or similar manner to the protective layer 510.

Having described various example embodiments of metamaterials for inhibiting the propagation of energy, either as a surface wave or in free-space, the following describes additional example embodiments that address techniques for implementing these example metamaterials to obtain effective shielding systems for a space in, for example, commercial, medical, government, and military settings. In this regard, according to some example embodiments, a shielding system may be implemented that combines three functions (i.e., reflection, attenuation of surface waves, and absorption of free-space energy) to overcome the limitations of a Faraday cage approach in isolation. According to some example embodiments, superior EM shielding may be achieved by combining Faraday cage shielding to reflect energy back into the space, surface wave attenuators to attenuate surface waves and minimize leakage from discontinuities in the Faraday cage shielding, and free-space absorbers to remove or absorb free-space energy from the space.

More specifically, according to some example embodiments, Faraday cage shielding may be installed in or on the structural surfaces (e.g., walls, ceilings, floors, etc.) to establish an EM barrier that reflects most EM energy into or away from the shielded space. Additionally, since energy incident on the Faraday cage may induce surface waves, a second feature may include preventing the movement of these surface waves using strategically placed surface wave attenuator metamaterials. These surface wave attenuator metamaterials may be positioned to form stop-band surfaces which will inhibit the propagation of surface waves. The energy of those waves may be attenuated and, in some instances, reflected back into the room by the surface wave attenuator metamaterial before the surface wave can reach a discontinuity. By doing so, a dramatic reduction in radiation through the discontinuities may be realized thereby enhancing the effectiveness of the system beyond the Faraday cage approach. Additionally, free-space energy may be removed from the system through the use of free-space absorber metamaterials. In this regard, EM energy incident onto, for example, the shielded walls may be absorbed by a free-space absorber metamaterial and turned to an insignificant amount of heat thereby reducing the energy available to escape the room via, for example, discontinuities in the Faraday cage shielding. The EM energy that is removed from the system, cannot leak from the room, and cannot be reflected back into the room to interfere with, for example, equipment and the like.

Example embodiments of surface wave attenuator metamaterials and example embodiments of free-space absorber metamaterials are provided herein, and these metamaterials may be leveraged in the context of a Faraday cage shielding implementation to achieve substantially improved shielding effectiveness. These metamaterials may be considered engineered composites with properties derived from the physical structure, not just from the chemistry of the components. The metamaterials may exhibit an electromagnetic response not observed in natural materials. Further, a metamaterial may comprise unit cells which are significantly sub-wavelength in dimension allowing the metamaterial to be defined as an effective medium where the designs can be scaled with wavelength.

The use of such metamaterials can operate to inhibit the propagation of EM waves within a space to be shielded. Such metamaterials may be formed as engineered composites with properties derived from their physical structure, in addition to the chemistry of the underling components. As such, the metamaterials can exhibit an EM response that is observed in natural materials. Such metamaterials can be comprised of unit cells which may be significantly sub-wavelength in dimension, thereby allow the metamaterials to be defined as an effective medium and can be scaled relative to a desired wavelength of operation.

Figure 24:
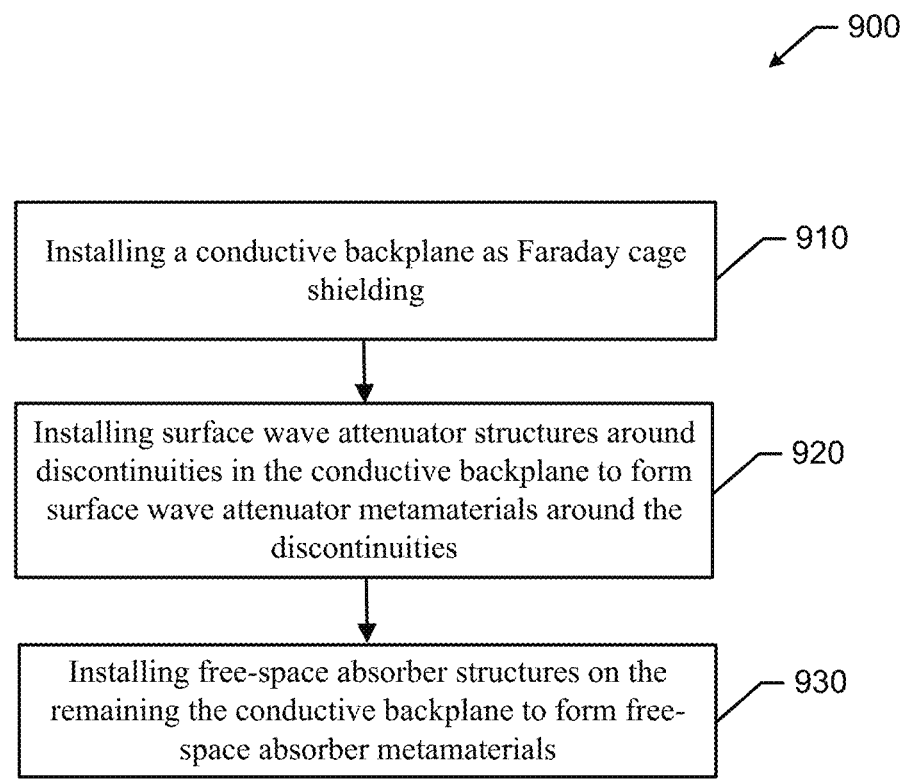
FIG. 24 illustrates a flowchart of an example method for electromagnetic shielding installation according to some example embodiments.
Figure 25A:
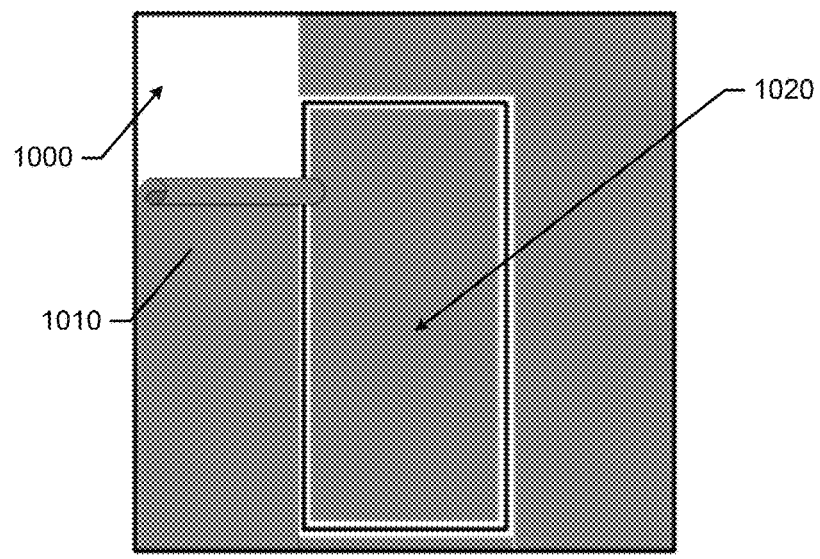
FIG. 25A illustrates a shielded wall with a door according to some example embodiments.
Figure 25B:
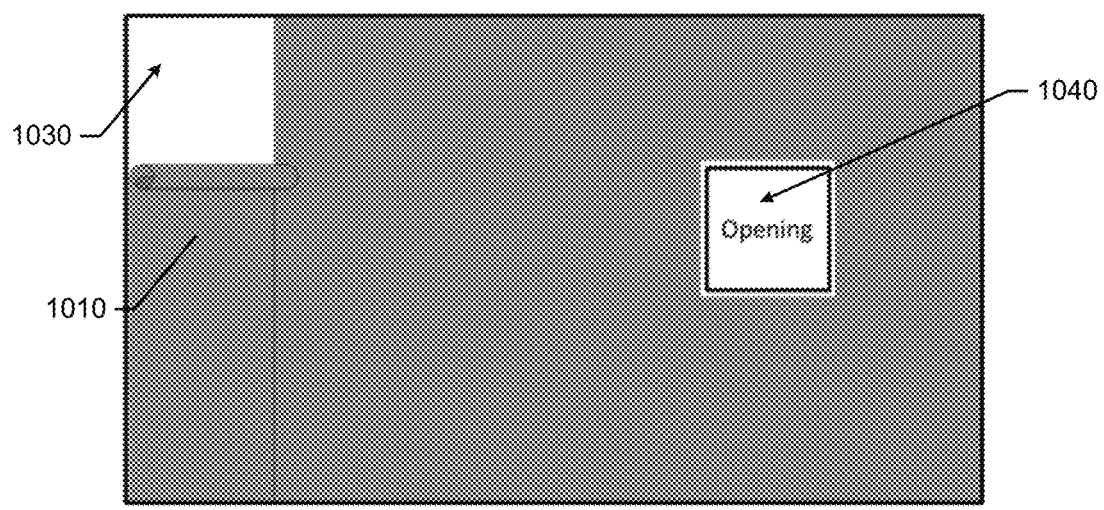
FIG. 25B illustrates a shielded wall with an opening according to some example embodiments.

In this regard, FIG. 24 illustrates a flowchart of an example method 900 for EM shielding installation according to some example embodiments. The example method may begin with installing a conductive backplane as Faraday cage shielding to the structural surfaces of the space at 910. According to some example embodiments, the conductive backplane may be used to from various metamaterials that may supplement the operation of the Faraday cage shielding. Various conductive materials and techniques may be used to install the conductive backplane and Faraday cage shielding as described herein. According to some example embodiments, a conductive foil may be applied to the walls, floors, and ceilings of a room or structure. Various techniques to ensure proper sealing between sheets of the conductive foil may be used. FIG. 25A shows an example application of an example conductive foil 1010 to a wall 1000 with a door opening 1020. As can be seen, the conductive foil 1010 may be applied to the wall 1000 and to the surface of the door 1020. FIG. 25B shows a similar application of conductive foil 1010 for Faraday cage shielding to another wall 1030, which has an opening 1040 (e.g., for a window). Again, the conductive foil 1010 is applied in sheets up to the edge of the opening 1040.

The example method 900 may continue at 920 with installing surface wave attenuator structures around discontinuities in the conductive backplane (e.g. doors, windows, ventilation openings, other openings, and the like) to form surface wave attenuator metamaterials around the discontinuities. In this regard, since the conductive backplane installed as the Faraday cage shielding may be used as a component of a surface wave attenuator metamaterial, according to some example embodiments, a surface wave attenuator structure that does not include a conductive backplane may be installed on the conductive backplane that was installed as the Faraday cage shielding. In example embodiments where the Faraday cage shielding operates as the conductive backplane of the surface wave attenuator metamaterial, the surface wave attenuator structures may be adhered or affixed in a manner that the vias electrically connect with the Faraday cage shielding. Examples surface wave attenuator metamaterials that may be used include the surface wave attenuator metamaterials 101 and 200 described herein or variations thereof, as well as any metamaterial built based on the surface wave attenuator structure 100. Further, according to some example embodiments, the SWAFSA metamaterial 800 may also be implemented here due to its surface wave attenuating features.

Figure 26A:
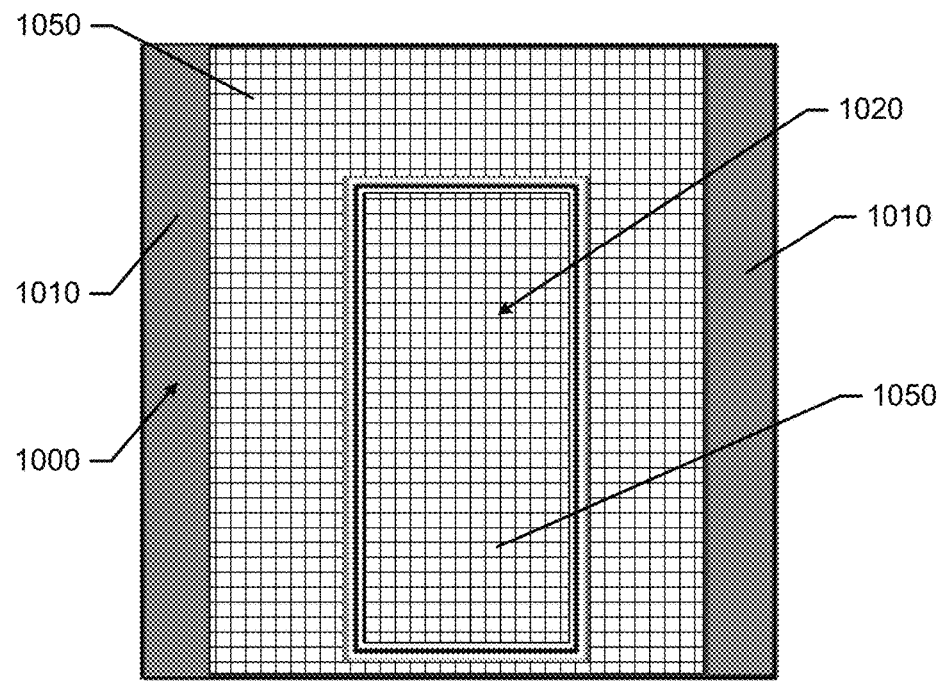
FIG. 26A illustrates a shielded wall with surface wave attenuator metamaterial installed around and on a door according to some example embodiments.

In this regard, with reference to FIG. 26A, surface wave attenuator structures 1050 (which may or may not include an integrated conductive backplane) may be applied to the conductive foil 1010 of the Faraday cage shielding on wall 1000. The surface wave attenuator structures 1050 may be applied to surround the door 1020, since the presence of the door 1020 creates a discontinuity that may be susceptible to surface wave re-radiation as described above. The surface wave attenuator structures 1050 may also be applied to the door 1020 itself.

Figure 26B:
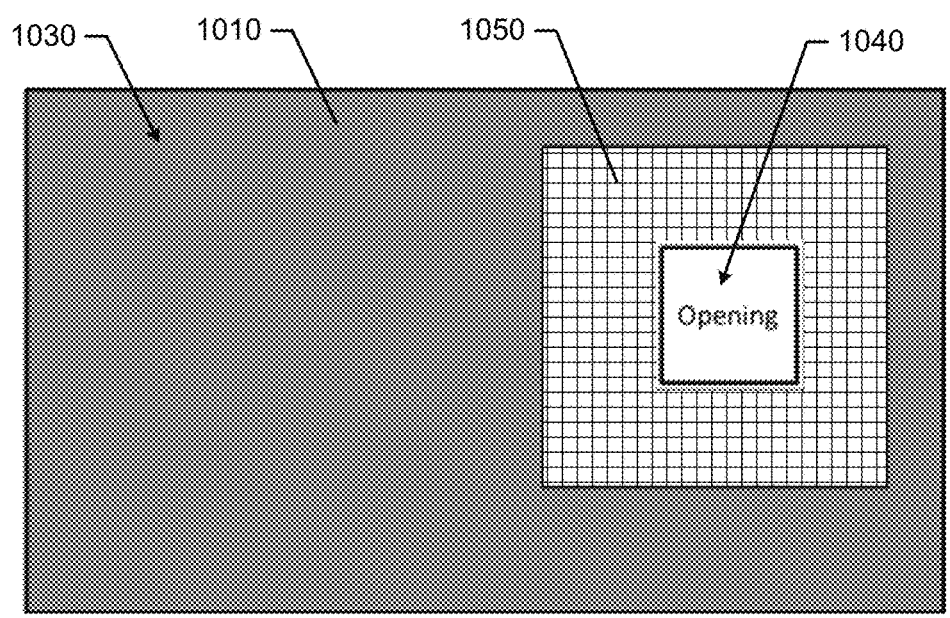
FIG. 26B illustrates a shielded wall with surface wave attenuator metamaterial installed around an opening according to some example embodiments.

With reference to FIG. 26B, surface wave attenuator structures 1050 may again be applied to the conductive foil 1010 of the Faraday cage shielding on wall 1030. The surface wave attenuator structures 1050 may be applied to surround the opening 1040, since the presence of the opening 1040 creates a discontinuity that may be susceptible to surface wave re-radiation as described above.

The example method 900 may also include, at 930, installing free-space absorber structures on the remaining conductive backplane to form free-space absorber metamaterials. According to some example embodiments, the free-space absorber structures may be placed on as much of the available structural surface as possible to maximize the energy absorption of the system and minimize energy reflection. According to some example embodiments, free-space absorber structures that have different operating frequencies and bandwidths may be mixed into the installation (e.g., within a single room) to broaden the performance range of the shielding system. Since the conductive backplane installed as the Faraday cage shielding may be used as a component of a free-space absorber metamaterial, according to some example embodiments, a free-space absorber structure that does not include a conductive backplane may be installed on the conductive backplane that was installed as the Faraday cage shielding. Since no electrical connection to the conductive backplane is needed in a free-space absorber metamaterial, the dielectric spacer of the free-space absorber structure may be adhered or affixed to the conductive backplane that is operating as the Faraday cage shielding. The free-space absorber structures may be installed on the portions of the conductive backplane that are not surrounding discontinuities or that have not been already covered by surface wave attenuator structures. Examples of such free-space absorber metamaterials include the free-space absorber metamaterial 500 or 600 described herein and variations thereof. Further, according to some example embodiments, the SWAFSA metamaterial 800 may also be implemented here due to its free-space energy absorbing features.

In this regard, with reference to FIG. 27A, free-space absorber structures in the form of tiles 1060 (which may or may not include an integrated conductive backplane) may be applied to the conductive foil 1010 of the Faraday cage shielding on wall 1000 that is not surrounding a discontinuity and not already covered by the surface wave attenuator structures 1050. Similarly, with respect to FIG. 27B, free-space absorber structures 1060 may again be applied to the conductive foil 1010 of the Faraday cage shielding on wall 1030 at locations that do not surround a discontinuity and already covered by the surface wave attenuator structures 1050. A final free-space absorber tile 1061 may be affixed to the conductive foil 1010 as shown.

Many modifications and other embodiments of the measuring device set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. A free-space absorber metamaterial comprising:
 a first array of patches disposed at a first plane, each patch in the first array of patches having a first patch area, and each patch in the first array of patches being formed to have a first electrical resistance;
 a conductive backplane disposed at a structural surface plane, the first plane and the structural surface plane being parallel; and
 a first dielectric spacer disposed between the first array of patches and the conductive backplane, the first dielectric spacer having a first width that defines a first gap distance between the first array of patches and the conductive backplane,
 wherein a first bandwidth of absorption for the free-space absorber metamaterial is based on the first patch area, the first electrical resistance, and the first gap distance.

2. The free-space absorber metamaterial of claim 1, further comprising a protective layer affixed to the first array of patches.

3. The free-space absorber metamaterial of claim 1, wherein the first dielectric spacer comprises a foam.

4. The free-space absorber metamaterial of claim 1, wherein the first dielectric spacer is formed as a rigid lattice structure.

5. The free-space absorber metamaterial of claim 1, wherein the patches of the first array of patches are formed of a carbon ink.

6. The free-space absorber metamaterial of claim 5, wherein the patches of the first array of patches are printed onto the dielectric spacer or a protective layer.

7. The free-space absorber metamaterial of claim 1, wherein the first array of patches are affixed to a first side of the dielectric spacer, and wherein a second side of the dielectric spacer is affixed to the conductive backplane during installation on a structural surface.

8. The free-space absorber metamaterial of claim 1 further comprising:
a second array of patches disposed at a second plane, each patch in the second array of patches having a second patch area that is different from the first patch area, and each patch in the second array of patches being formed to have a second electrical resistance that is different from the first electrical resistance; and
a second dielectric spacer disposed between the first array of patches and the second array of patches.

9. The free-space absorber metamaterial of claim 8, wherein the second dielectric spacer has a second width, and a second gap distance associated with the second array of patches is defined as a combination of the first width and the second width;
wherein a second bandwidth of absorption for the free-space absorber metamaterial is based on the first patch area, the first electrical resistance, the first gap distance, the second patch area, the second electrical resistance, and the second gap distance.

10. The free-space absorber metamaterial of claim 9 wherein the first array of patches has a first pitch and the second array of patches has a second pitch; and wherein the first pitch is greater than the second pitch.

11. The free-space absorber metamaterial of claim 8 further comprising:
a third array of patches disposed at a third plane, each patch in the third array of patches having a third patch area that is different from the first patch area and the second patch area, and each patch in the third array of patches being formed to have a third electrical resistance that is different from the first electrical resistance and the second electrical resistance; and
a third dielectric spacer disposed between the second array of patches and the third array of patches.

12. The free-space absorber metamaterial of claim 11, wherein
the third dielectric spacer has a third width, and a third gap distance associated with the third array of patches is defined as a combination of the first width, the second width, and the third width, and
a third bandwidth of absorption for the free-space absorber metamaterial is based on the first patch area, the first electrical resistance, the first gap distance, the second patch area, the second electrical resistance, the second gap distance, the third patch area, the third electrical resistance, and the third gap distance.

13. The free-space absorber metamaterial of claim 12, wherein
the first array of patches has a first pitch, the second array of patches has a second pitch, and the third array of patches has a third pitch, and
the first pitch is greater than the second pitch, and the second pitch is greater than the third pitch.

14. The free-space absorber metamaterial of claim 1 wherein the first array of patches is affixed to the first dielectric spacer to form a tile.

15. A free-space absorber metamaterial structure comprising:
a first array of patches disposed at a first plane, each patch in the first array of patches having a first patch area, and each patch in the first array of patches being formed to have an electrical resistance;
a first dielectric spacer disposed adjacent to the first array of patches, the first dielectric spacer having a first width that defines a first gap distance for the first array of patches;
a second array of patches disposed at a second plane, each patch in the second array of patches having a second patch area that is different from the first patch area, and each patch in the second array of patches being formed to have a second electrical resistance that is different from the first electrical resistance; and
a second dielectric spacer disposed between the first array of patches and the second array of patches, the second dielectric spacer having a second width, and a second gap distance associated with the second array of patches is defined as a combination of the first width and the second width;
wherein a bandwidth of absorption for a free-space absorber metamaterial formed using the free-space absorber metamaterial structure is based on the first patch area, the first electrical resistance, the first gap distance, the second patch area, the second electrical resistance, and the second gap distance.

16. The free-space absorber metamaterial structure of claim 15 further comprising a conductive backplane, wherein the inclusion of the conductive backplane forms a free-space absorber metamaterial having the bandwidth of absorption.

17. The free-space absorber metamaterial structure of claim 15 further comprising a protective layer disposed on the second array of patches.

18. A metamaterial comprising:
an array of patches disposed at a first plane, each patch in the array of patches having a patch area;
a conductive backplane disposed on a structural surface plane, the first plane and the structural surface plane being parallel;
a first dielectric disposed between the array of patches and the conductive backplane, the first dielectric having a first width;
a plurality of vias disposed within the first dielectric, wherein each via in the plurality of vias electrically connects a respective patch in the array of patches to the conductive backplane;
a resistive layer having a resistance per unit area; and
a second dielectric disposed between the resistive layer and the array of patches, the second dielectric having a second width, a gap distance for the resistive layer being a combination of the first width and the second width;
wherein a first bandwidth of absorption for the metamaterial is based on the resistance per unit area and the gap distance for the resistive layer; and
wherein an attenuation frequency for the metamaterial is based on the patch area and a via inductance.

19. The metamaterial of claim 18, wherein each of the vias in the plurality of vias comprises a spring.

20. The metamaterial of claim 18, further comprising a second resistive layer and a third dielectric disposed between the second resistive layer and the first resistive layer.

* * * * *